(12) United States Patent
Higashi et al.

(10) Patent No.: US 6,291,891 B1
(45) Date of Patent: Sep. 18, 2001

(54) SEMICONDUCTOR DEVICE MANUFACTURING METHOD AND SEMICONDUCTOR DEVICE

(75) Inventors: Kazuyuki Higashi, Yokohama; Noriaki Matsunaga, Chigasaki; Akihiro Kajita, Yokohama; Tetsuo Matsuda, Gunma-ken; Tadashi Iijima, Yokohama; Hisashi Kaneko, Fujisawa; Hideki Shibata, Yokohama; Naofumi Nakamura; Minakshisundaran Balasubramanian Anand, both of Yokohama; Tadashi Matsuno, Oita; Katsuya Okumura, Yokohama, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/228,642

(22) Filed: Jan. 12, 1999

(30) Foreign Application Priority Data

Jan. 13, 1998 (JP) .................................................. 10-005066
Mar. 28, 1998 (JP) .................................................. 10-100627
Jul. 3, 1998 (JP) .................................................. 10-202837

(51) Int. Cl.$^7$ .......................... H01L 23/48; H01L 29/40; H01L 23/52
(52) U.S. Cl. .......................... 257/774; 257/750; 257/751; 257/752
(58) Field of Search .................................. 257/774, 751, 257/752, 763, 764, 765, 762; 438/629, 637, 639, 640, 667, 668, 672, 675, 700, 701, 713, 978

(56) References Cited

U.S. PATENT DOCUMENTS

| 4,914,056 | | 4/1990 | Okumura | 438/629 |
| 5,436,199 | | 7/1995 | Brighton | 438/629 |
| 5,970,373 | * | 10/1999 | Allen | 438/624 |
| 5,982,040 | * | 11/1999 | Yamada et al. | 257/776 |
| 6,001,730 | * | 12/1999 | Farkas et al. | 438/627 |
| 6,008,114 | * | 12/1999 | Li | 438/618 |
| 6,100,184 | * | 8/2000 | Zhao et al. | 439/638 |

FOREIGN PATENT DOCUMENTS

| 7-45706 | 2/1995 | (JP) . |
| 8-241893 | 9/1996 | (JP) . |
| 9-102545 | 4/1997 | (JP) . |

* cited by examiner

Primary Examiner—Jhihan B Clark
(74) Attorney, Agent, or Firm—Finnegan, Henderson, Farabow, Garrett & Dunner, L.L.P.

(57) ABSTRACT

A semiconductor device manufacturing method comprises a step of forming a trench to a first insulation film formed on a semiconductor substrate, and forming a lower level wiring in the trench, a step of forming at least one conductive layer on the semiconductor substrate to coat the lower level wiring, a step of forming at least one thin film layer on the conductive layer, a step of forming a hard mask by patterning the thin film, a step of etching the conductive layer by using the hard mask as an etching mask, and forming a conductive pillar-shaped structure, whose upper surface is covered with the hard mask, on the lower level wiring, a step of forming a second insulation film on the semiconductor substrate so that the pillar-shaped structure is buried, a step of forming a wiring trench in which at least the hard mask is exposed, and a step of burying a conductor into the wiring trench after the hard mask is removed, and forming an upper level wiring in the wiring trench.

26 Claims, 17 Drawing Sheets

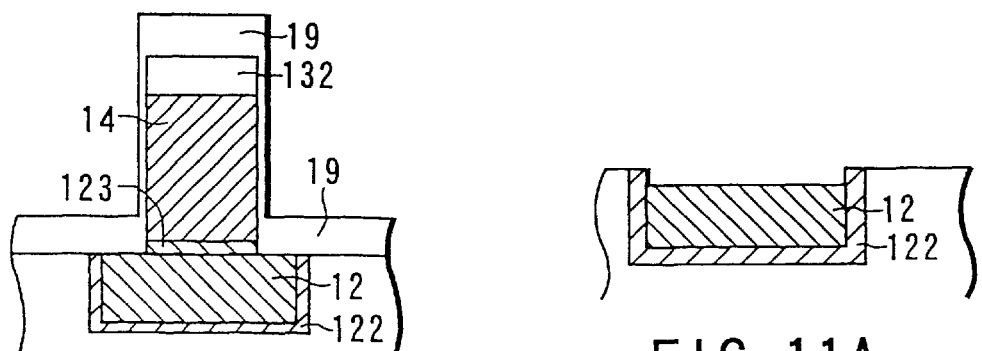
FIG. 10
FIG. 11A
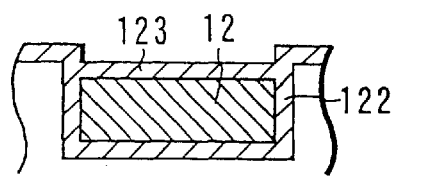
FIG. 11B
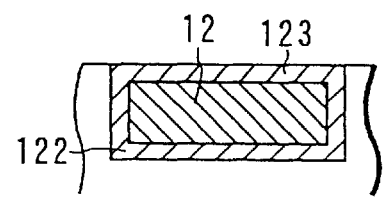
FIG. 11C
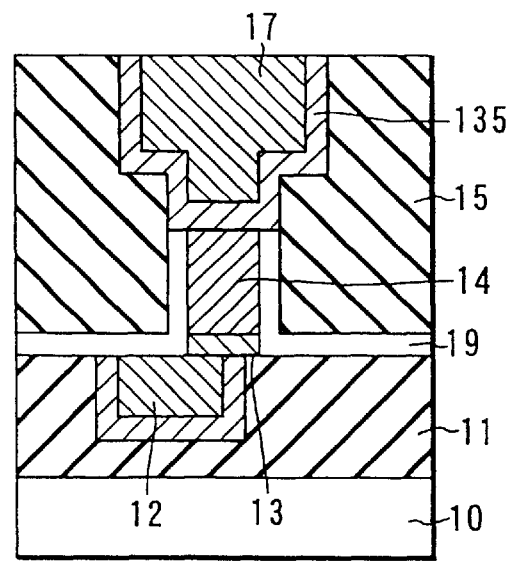
FIG. 12

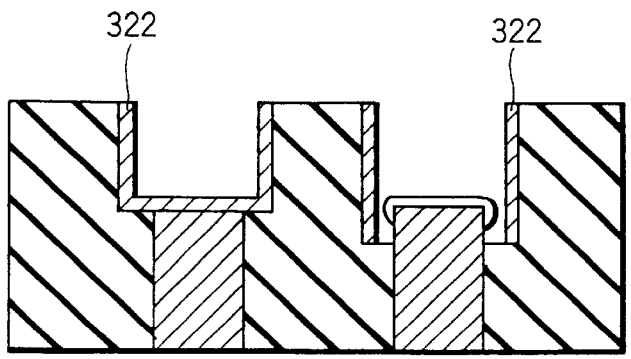
FIG. 15
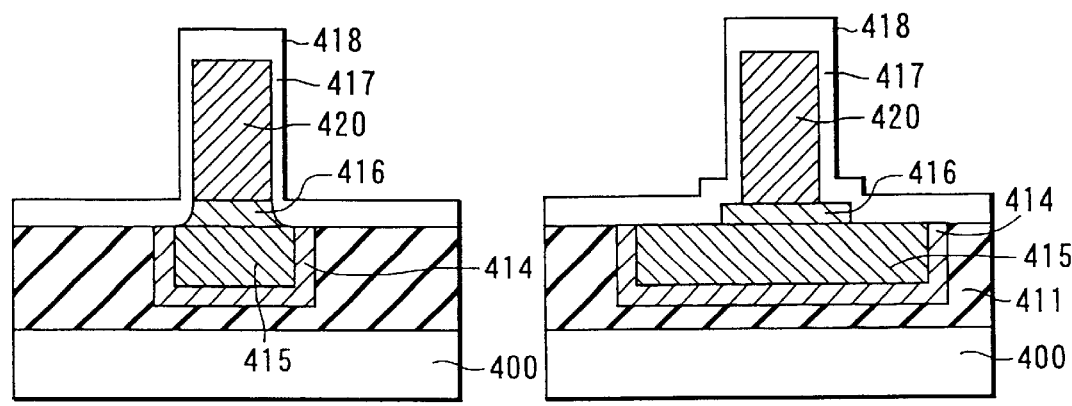
FIG. 16A  FIG. 16B
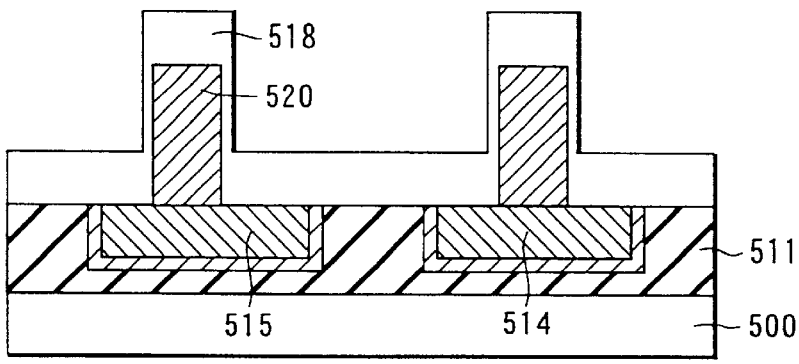
FIG. 17A
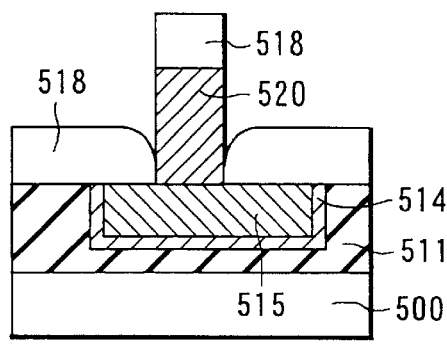 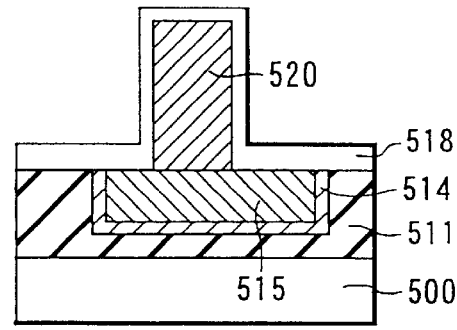
FIG. 17B  FIG. 18

SEMICONDUCTOR DEVICE MANUFACTURING METHOD AND SEMICONDUCTOR DEVICE

BACKGROUND OF THE INVENTION

The present invention relates to a semiconductor device of multi-level wiring structure such as a logic LSI (Logical Large Scale Integrated Circuit), a DRAM (Dynamic Random Access Memory), SRAM (Static RAM), a CMOS (Complementary Metal Oxide Semiconductor) or a bipolar transistor (Bipolar Transistor), especially, to a formation of multi-level wiring which includes via-contact formation using wiring formation and a conductive pillar-shaped structure (pillar), and a semiconductor device which has a multi-level wiring structure.

Conventionally, in general, when a connection plug, which electrically connects between the wirings of the upper level and the lower level in the multi-level wiring structure of the semiconductor device, is formed, a method of opening a contact hole by using a reactive ion etching (RIE (Reactive Ion Etching)) method etc. for an interlevel insulation film, and forming the connection plug by burying a conductive material such as metal is used.

This conventional art has the following disadvantages. At the RIE for the opening of the contact hole, physical damage and corrosion are caused on the surface of lower level wiring exposed to the bottom of the contact hole with the etching gas and the sputtered particle. A contact resistance between the above-mentioned connection plug and the lower level wiring rises by adhering the etching residue and the sputtered particle. When the contact hole is not formed at a desired position by the occurrence of the missalignment with the lower wiring pattern at formation of the contact hole, the lower wiring side and the interlevel insulation film thereunder are excessively etched by RIE. In addition, the undesirable short-circuit with the wiring of the lower level is occurs, and the cave remains around a fine wiring. As a result, the reliability lowers.

When the lower level wiring is formed, a method of forming a conductive pillar-shaped structure (pillar) and the lower level wiring at the same time is known. This method is a method of depositing a metal film on the insulation film formed on the semiconductor substrate, forming the connection plug with a photo-lithography and the etching methods such as an RIE and leaving a metal film in the trench to form the lower level wiring. However, the lower level wiring is the same material as the connection plug, and changing both of the material cannot broaden the variety of the selection of the material. Moreover, when the connection plug is etched, the lower level wiring might be over-etched. In addition, the missalignment might be occurred when the connection plug and the upper level wiring are connected.

Recently a high speed operation has come to be requested to the device. Therefore, a lower resistance material is required as for the wiring material. Copper (Cu) has been paid attention so as to respond to the request and is multi-used. The electrical resistivity of the copper is 1.8 $\mu\Omega$cm, and it is greatly low among the wiring material. Besides this, tungsten (W) whose resistivity is 10 to 20 $\mu\Omega$cm and aluminum (Al) whose resistivity is 3 to 4 $\mu\Omega$cm are used as well as a wiring material. Therefore, AlCu alloy is used as any of the lower level wiring 12, the connection plug 14 (conductor pillar), and the upper level wiring 18 shown in FIG. 1A and FIG. 1B, for example, but is considered that the wiring resistance is reduced by using Cu for the lower level wiring 12 and the upper level 18, and using Al for the connection plug 14.

However, the.inconvenience might happen when Cu is used as it is. First, Cu has characteristics to diffuse into the insulation film in the state of the atom when Cu is covered by the insulation film. Especially, the moving of Cu becomes active if Cu is heated by the use of the device and the heat-treating step under manufacturing, then the wiring is destroyed and comes to cause the disconnection and the short-circuit accident easily. Moreover, the surface is oxidized when Cu is exposed in (the) air, and advantage of the low resistance is lost.

Moreover, in the above-mentioned pillar technology, since the pillar-shaped structure (pillar) is formed only to connection part of the lower level wiring and the upper level wiring, the ratio of the region where the pillar-shaped structure is formed becomes very small and is about several % or less of the whole. Therefore, the pillar-shaped structure is excessively etched, for example, when the drying etching, and the processing of the pillar-shaped structure becomes difficult. The planarity of the interlevel insulation film formed after processing of the pillar-shaped structure deteriorates.

As described above, since the ratio of the region where the pillar-shaped structure is formed is very small when the pillar technology is used for the connection of the lower level wiring and the upper level wiring, there is a subject matter of a bad processing control of the pillar-shaped structure and a bad planarity of the interlevel insulation film.

BRIEF SUMMARY OF THE INVENTION

An object of the present invention is as follows.

(1) To provide a semiconductor device manufacturing method having the multi-level wiring structure which can secure the space, in which the contact structure between the lower level wiring and the upper level wiring is arranged, before depositing the interlevel insulation film, can prevent from the damage at RIE and impurities on the surface of wiring under the contact hole, and can secure the reliability with the contact of the lower level wiring even if the missalignment is occurred at the contact hole.

(2) To provide a semiconductor device manufacturing method which has the multi-level wiring structure to connect between wirings in which the protection film to control the diffusion of the wiring material into the insulation film (or, to control the oxidation of the wiring material) can be deposited without greatly increasing steps, and the semiconductor device manufactured by the method.

(3) To provide a manufacturing method capable of improving the processing controllability and the planarity of the interlevel insulation film of the pillar-shaped structure (pillar) when the pillar technology is used to connection step of the lower level wiring and the upper level wiring.

According to the first aspect of the present invention, in the semiconductor device manufacturing method or the semiconductor device, a hard mask is formed on upper portion of the pillar, the process is advanced with leaving the hard mask, and the hard mask is removed immediately before connecting the pillar with the upper level wiring, when the lower level wiring (the first buried wiring) and the upper level wiring (the second wiring) are connected with the pillar-shaped structure (pillar). Where, it is desirable to form a protection film on the surface of the lower level wiring uncovered with at least the pillar-shaped structure after the pillar-shaped structure is formed.

The hard mask may be a silicon oxide, a silicon nitride, or a tungsten.

The first aspect of the present invention comprises the following features. First, after the first buried wiring (lower level wiring) which consists of Cu is formed on the first interlevel insulation film, a conductive layer, in which the connection plug which consists of, for example, Al/W/WN or Cu, etc. is formed, is formed. Next, this conductive layer is processed to the connection plug by the lithography technology and the RIE method. That is, in the first aspect of the present invention, a hard mask materials such as the silicon nitride film or the silicon oxide film for forming the connection plug is deposited as an etching mask on a conductive layer where the connection plug is formed. The protection film such as silicon nitride films ($Si_3N_4$) with an effect by which the diffusion of Cu to the interlevel insulation film is controlled and an effect by which the oxidation of the Cu surface is controlled is deposited on the connection plug and the first interlevel insulation film by the CVD method or the reactive sputtering method, etc. as desired thickness if necessary. Thereafter, the second interlevel insulation film is deposited, the upper level wiring is buried in the second interlevel insulation film. As a result, the lower level wiring and the upper level wiring are connected by the connection plug.

In addition, since the protection film which has a Cu diffusion prevention effect and an oxidation control effect in the region where the connection plug on the first buried wiring (lower level wiring) does not exist is deposited, and neither the first buried wiring (lower level wiring) nor the interlevel insulation film are not contacted directly unlike the conventional ones, an excellent characteristic is obtained without requiring the complicated steps. Both of the hard mask and the protection film also have an advantage of enlarging the difference allowance in the depth direction when the second wiring trench is processed.

Therefore, the difference allowance in the depth direction is enlarged, and the poor coverage of the barrier metal of the upper level is prevented by the present invention. In addition, the Cu diffusion from the lower level wiring can be prevented according to the present invention.

The upper surface of the pillar to take the electric contact with the wiring can be prevented from oxidizing during the process, being polluted, and occurring the chemical reaction by leaving a hard mask until the formation of the second wiring trench.

In the second aspect of the present invention, a semiconductor device comprises: a semiconductor substrate in which a first insulation layer having a trench where a lower level wiring is buried is formed; a conductive layer having a component which includes a barrier metal function formed on the lower level wiring; a conductive pillar-shaped structure which is connected with the conductive layer and is formed on the semiconductor substrate; and a second insulation layer formed on the semiconductor substrate in order to surround the pillar-shaped structure, and the second insulation layer has a trench formed to expose an upper portion of the pillar-shaped structure. And, an upper level wiring which is electrically connected with the pillar-shaped structure is formed in the trench.

The preferred manner of the second aspect is as follows.

(1) The conductive layer has at least two layers. Or, the conductive layer includes WN, and, desirably, the conductive layer further includes W. The connection plug on the first buried wiring (lower level wiring) has, for example, Al which is a main material of the connection plug and a conductive layer to prevent from over-etching to the first buried wiring when the Al is processed to the pillar-shaped structure by the RIE processing. In addition, when each material of the first buried wiring and the connection plug is different, for example, Cu as the wiring material and Al as the plug material. For example, WN can be applied as a conductive layer to meet this requirement, but since the WN has a high resistivity, the WN raises the entire resistance of the connection plug when a necessary film thickness is formed to have enough stopper function. Therefore, preferably, W which has only the stopper function and the electrical resistivity thereof is small is stacked thereto. As a result, the connection plug having the stopper function and the barrier function as W and WN stacking film, and low resistance can be formed. That is, the above-mentioned advantage is achieved by which the conductive layer has at least first and second layers, the first layer of the conductive layer functions as an etching stopper and a barrier layer when the pillar-shaped structure is processed, and the second layer of the conductive layer has a lower resistance than the first layer of the conductive layer, and functions as an etching stopper when the pillar-shaped structure is processed.

(2) The surface of the lower level wiring and the first insulation layer is substantially in the same plane, the conductive layer is formed so as to be connected with at least a part of the lower level wiring, and the semiconductor device further comprises a protection film covering the surface of the lower level wiring which is uncovered with the pillar-shaped structure and formed to be deposited on an upper portion of the pillar-shaped structure. The allowance becomes large since the protection film can be used as a position alignment allowance between the second wiring trench bottom and the upper surface of the pillar in the depth direction.

(3) The conductive layer is formed in the trench to cover all surfaces of the lower level wiring. Though the lower level wiring is covered with the protection film for preventing the Cu diffusion in (2), there is an advantage of reducing the capacity between the wirings since it is unnecessary to cover the upper surface of the wiring with the protection film having high permittivity (for example, SiN).

(4) The conductive layer includes the material which can be selectively etched for the first insulation film. Where, a horizontal section of the pillar-shaped structure is narrower than a horizontal section of the conductive layer. The pillar-shaped structure or the conductive layer has the shape of widening toward the end. The protection film formed to cover a sidewall of the pillar-shaped structure, the lower level wiring, and the first insulation layer is further provided.

(5) The pillar-shaped structure includes copper or an alloy thereof.

(6) The conductive layer is used as a CMP stopper when the lower level wiring is formed by the CMP.

According to the second aspect of the present invention, the protection film which has a Cu diffusion prevention effect and an oxidation control effect is deposited in the region where the connection plug on the first buried wiring (lower level wiring) does not exist, and since neither the first buried wiring (lower level wiring) nor the interlevel insulation film are not contacted directly unlike the conventional ones, an excellent characteristic can be obtained without requiring the complicated steps. In addition, the protection film consisting of the silicon nitride film deposited on the connection plug, also has the same function as the hard mask which enlarges the difference allowance in the depth direction when the second wiring trench is processed.

Moreover, since the narrow space between connection plug and the side of the second wiring trench, which is formed when the position of the bottom of the upper level wiring is lower than an uppermost surface of the connection plug, is not made, a coverage degradation etc. of the barrier metal of the upper level wiring in this part are prevented.

A part of the bottom of the connection plug shifts from the lower level wiring because of miss alignment when the connection plug is formed on the lower level wiring with borderless structure (without fringe at the connection region for a alignment allowance). Then, over-hanging shape is optionally provided under the connection plug by forming a conductive layer, which has a broader horizontal section than the pillar-shaped structure, on the first interlevel insulation film to surely achieve the protection film formation on this part, and the protection film with high reliability which can surely cover and protect the connection plug is formed.

According to the present invention, in the multi-level wiring structure interconnected by using a pillar-shaped connection plug, the formation of the protection film to which the entire pillar is covered becomes possible. The possibility of the metal material which can be selected as the connection plug extends, and, for example, the material with an extremely low electrical resistivity like copper can be selected.

According to the third aspect of the present invention, a semiconductor device comprises a plurality of pillar-shaped structures formed in connection regions where a lower level wiring and an upper level wiring are electrically connected, a plurality of dummy pillar-shaped structures formed in predetermined regions except the connection regions, and an interlevel insulation film formed to cover the plurality of pillar-shaped structures, wherein layout data of the dummy pillar-shaped structures formed in the predetermined regions are obtained by a NOR processing of corresponding data to both information which are based on a layout information of layout of the lower level wiring and layout information of layout of the upper level wiring. Where, the pillar-shaped structures formed in the connection regions and the predetermined regions are formed with the conductor.

Moreover, another semiconductor device according to the third aspect of the present invention comprises a plurality of pillar-shaped structures formed in connection regions where a lower level wiring and an upper level wiring are electrically connected, a plurality of dummy pillar-shaped structures formed in predetermined regions except the connection regions, and an interlevel insulation film formed to cover the plurality of pillar-shaped structures, wherein data of layout of the pillar-shaped structures formed in the predetermined regions is obtained by a NOT processing of data corresponding to the information based on layout information at the layout of the connection region.

The preferred manners of the third aspect of the present invention are as follows.

(1) The pillar-shaped structures formed in the connection regions are removed, after the interlevel insulation film is formed.

(2) The dummy pillar-shaped structures formed in the connection region and the predetermined regions are formed with an insulator.

(3) The dummy pillar-shaped structures formed in the predetermined regions are formed in regions except the predetermined specific regions.

According to the third aspect of the invention, the pillar-shaped structures (pillars) are formed in regions other than the connection regions where the lower level wirings and the upper level wirings are electrically connected. Therefore, the ratio of the regions where the pillar-shaped structures are formed can be greatly increased locally and/or overall, the processing controllability of the pillar-shaped structures, which is difficult in conventional ones, can be improved, and the planarity of the interlevel insulation film can be improved.

The layout of the pillar-shaped structures (dummy pillar-shaped structures) formed in the predetermined regions except the connection regions can be determined by the following arithmetic processing.

The method of the first arithmetic processing is a method of performing a NOR processing of data corresponding to both information which are based on a layout information of layout of the lower level wiring and a layout information of layout of the upper level wiring. An OR processing of the data obtained by the above mentioned arithmetic processing with the data corresponding to the connection region is preformed, and a mask to form the pillar-shaped structures based on the data obtained by the OR processing is manufactured. The mask pattern data, which corresponds to the dummy pillar-shaped structures, can be generated by performing the processing divided the region corresponding to the data obtained for example by the NOR processing into the plurality of island-shaped regions which are mutually separated.

The pillar-shaped structure is formed in the regions where neither the lower level wiring nor the upper level wiring are arranged besides the connection region of the lower level wiring and the upper level wiring by the pattern transfer using the mask thus manufactured. Therefore, the ratio of the region where the pillar-shaped structures are formed can be increased locally and/or overall.

When the pillar-shaped structures are formed by using the mask manufactured by the first arithmetic processing method, it is also possible to leave the pillar-shaped structures without removing after the interlevel insulation film is formed since the pillar-shaped structures are not formed in the regions where the lower level wirings and the upper level wirings are arranged. Therefore, the pillar-shaped structures formed in the connection regions and the predetermined regions except connection regions are formed with the conductor, and the pillar-shaped structures formed in connection regions can be used as the connection material of the lower level wirings and the upper level wirings.

The second arithmetic processing method is performing NOT processing of data corresponding to the information which is based on the layout information of the layout of connection regions of the lower level wiring and the upper level wiring. The OR processing of data obtained by the above mentioned arithmetic processing and data corresponding to connection regions is performed, and the mask to form the pillar-shaped structures based on the data obtained by this OR processing is manufactured. For example, the mask pattern data corresponding to the dummy pillar-shaped structures can be generated by performing the processing which divides the region corresponding to data obtained by a NOT processing into the plurality of island-shaped regions being mutually separated.

The pillar-shaped structures can be formed in all regions except connection regions of the lower level wiring and the upper level wiring by transferring the pattern using the mask manufactured described above. That is, it is different from the first arithmetic processing method, and it becomes possible to form the pillar-shaped structures in the regions where the lower level wirings and the upper level wirings are arranged. Therefore, the ratio of the region where the pillar-shaped structures are formed can become larger than the first arithmetic processing method.

When the pillar-shaped structures are formed in the predetermined regions except connection regions by the manufacturing method, for example, the first arithmetic processing method or the second arithmetic processing method, the pillar-shaped structures in the predetermined regions may be formed only in the regions except the predetermined specific regions (specific circuit region).

That is, when the layout of the pillar-shaped structures are determined by the arithmetic processing, the dummy pattern of the pillar-shaped structures is not generated for the predetermined specific region. Specifically, the dummy pattern is prevented from being generated for an undesirable specific regions, in which the dummy pillar-shaped structures are formed, in the circuit performance and the chip characteristic.

For example, the following regions are given as specific regions where the dummy pattern is not generated. First, regions where the circuit influenced by the parasitic capacity caused by the interlevel insulation film is arranged can be given. Regions where the spare circuit section, the redundancy circuit section, and the fuse section arranged in the circuit section are formed can be also given. In addition, regions where the terminal section (PAD section) for an external connection is formed and other regions where the dicing line section is provided can be given as specific regions.

As described above, according to the present invention, the pillar-shaped structures are formed in regions other than connection regions where the lower level wiring and the upper level wiring are electrically connected. Therefore, the ratio of the region where the pillar-shaped structure is formed can be greatly increased locally and overall, a processing controllability by pillar-shaped structure which is difficult conventionally can be improved, and improving the planarity of the interlevel insulation film becomes possible.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 10 shows another embodiment in the step of FIG. 9E;

FIG. 11A to FIG. 11C show the second modification of the third embodiment;

FIG. 12 is a sectional view of the semiconductor device which explains the fourth embodiment;

FIG. 15 is a manufacturing step sectional view of the semiconductor device according to the fifth embodiment;

FIG. 16A and FIG. 16B are the manufacturing step sectional views of the semiconductor device according to the sixth embodiment;

FIG. 17A and FIG. 17B are the manufacturing step sectional views of the semiconductor device according to the seventh embodiment;

FIG. 18 is a manufacturing step sectional view of the semiconductor device according to the seventh embodiment;

DETAILED DESCRIPTION OF THE INVENTION

Figure 1A:
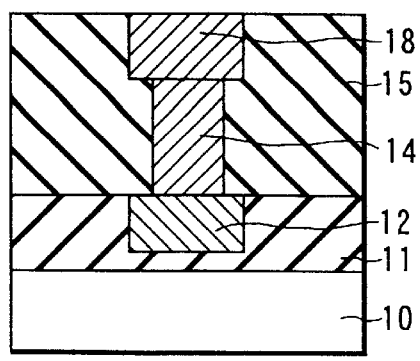
FIG. 1A and FIG. 1B are the conventional manufacturing step sectional view and plan views of the semiconductor device.

Hereinafter, the embodiment of the invention will be explained referring to the drawings.

The first embodiment of the present invention will be explained referring to FIG. 2A to FIG. 4B.

The semiconductor device manufacturing method according to the present invention is applied to a step (Hereinafter, referred to as Damascene step) of processing a trench-shaped or a hole-shaped trench to an insulation film when the semiconductor device is manufactured, and forming a buried wiring therein by depositing a conductive material such as the metals. Then, the pillar-shaped temporary connection plug (pillar-shaped structure: Pillar) is formed with an arbitrary material in the part which becomes a connection plug when the connection wiring (Hereinafter, referred to as a "connection plug"), to which an upper level wiring and a lower level wiring are connected, is formed. Thereafter, an interlevel insulation film is deposited. When the conductor is used for the temporary connection plug material, it is left as connection wiring. In a step of processing the trench for the upper level wiring and burying the wiring material or a step of replacing the pillar-shaped structure for the connection wiring material, the replacing step is performed before or after processing the trench of the upper level wiring, and thereafter or simultaneously the wiring material of the upper level wiring is buried.

It becomes possible to secure the space for arranging a contact between the lower level wiring and the upper level wiring before depositing the interlevel insulation film by using this method. It becomes possible to form the connection plug having the low resistance since opening step of the conventional contact hole, which has the problems such as the damage at RIE and lying impurities at the bottom of the hole, is unnecessary. In addition, the reliability of the contact with the lower level wiring can be secured even if the missalignment is occurred at the step of contact plug formation. The size restriction to the connection plug can be lost and the processing allowance can be enlarged by using the pillar step, though by the similar reasons it is necessary to reduce the diameter of a contact hole more than the width of the lower level wiring, in the conventional hole opening step. Here, "Allowance" is an allowance (permission) of the position alignment in the horizontal direction of the wiring and the connection plug.

Figure 3A:
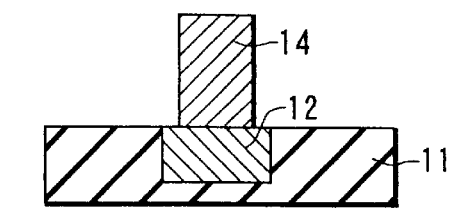
FIG. 3A and FIG. 3B are the manufacturing step sectional view and plan view of the semiconductor device according to the first embodiment.
Figure 1B:
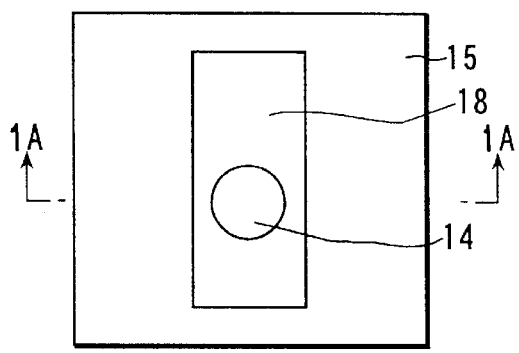
Figure 3B:
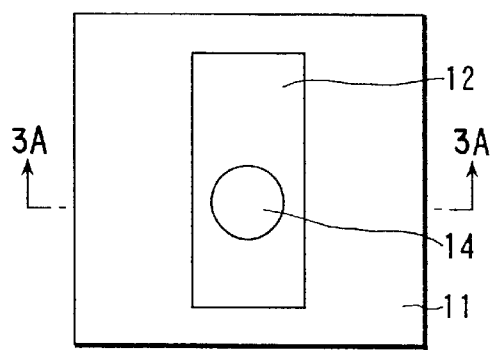
Figure 2A:
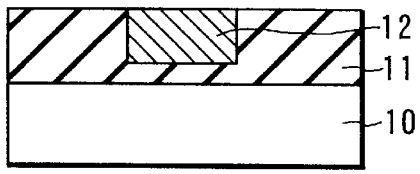
FIG. 2A and FIG. 2B are the manufacturing step sectional view and plan view of the semiconductor device according to the first embodiment.
Figure 4A:
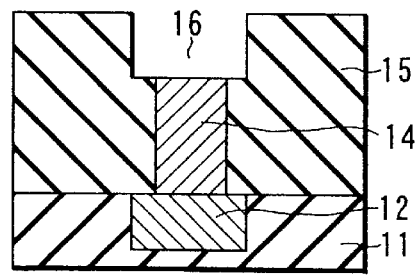
FIG. 4A and FIG. 4B are the manufacturing step sectional view and plan view of the semiconductor device according to the first embodiment.

Hereafter, an example of the above-mentioned conventional art will be explained referring to the drawings. In this example, a method of forming a connection plug by using a conductor pillar, and forming an upper level wiring connected to this connection plug will be described. FIG. 2A to FIG. 4B are manufacturing step sectional view and a plan view of the semiconductor device according to the present invention. The semiconductor substrate 10 is shown in FIG. 2A and FIG. 4A, but is omitted in other Figures. For example, the silicon semiconductor is used for the semiconductor substrate 10.

Figure 2B:
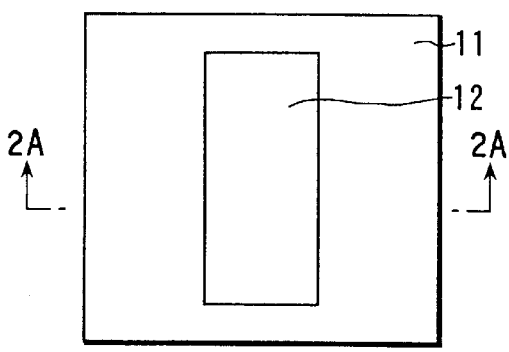

A first insulation film 11, which consists of the silicon oxide film etc. formed by the CVD (Chemical Vapor Deposition) method etc. on the semiconductor substrate 10, is formed. The first insulation film 11 is planarized, and the first wiring trench of the same shape as the wiring pattern of the lower level wiring is formed on the surface thereof. The metal, which consists of, e.g., the AlCu alloy, is buried in the first wiring trench, and the lower level wiring 12, which is the first wiring, is formed (FIG. 2A and FIG. 2B). Here, the aluminum alloy (AlSiCu), Cu, and W, etc. generally used as a wiring material for a material of the lower level wiring 12 may be used. Next, the AlCu metal layer is formed on the first insulation film 11 and the lower level wiring 12 by the sputtering method etc. Thereafter, the pattern of the pillar-shaped structure 14 (Hereinafter, called as a pillar) is formed by etching the AlCu metal layer by the RIE method etc. Though AlCu is used here as a pillar material, it is desirable the metal layer is the material which can be used as a fine metallic wiring and has a low resistivity, and, for example, Al, AlSiCu, and Cu, etc. can be used.

Next, a second insulation film 15, which consists of the silicon oxide film etc., is formed by either the CVD method or the spin coat method, etc. to bury the pattern of the conductor pillar 14 which consists of the metal layer. The step of forming the second insulation film 15 is divided into several-steps and a step of reforming the insulation film by performing heat-treating etc. may be added during the several-steps for the purpose to improve the planarity of the buried insulation film and the purpose to improve the step coverage and the gas filling. Moreover, the stacking structure of several kinds of different insulation films can be used as the second insulation film 15. In addition, the planarizing step can be added by using a chemical mechanical polishing (CMP) method or the resist etch-back method, etc. to decrease the roughness of the surface of the formed second insulation film 15. By thinning the thickness of the film of the second insulation film 15 than a height of the conductor pillar 14 to expose the top of the pillar 14, the surface can be planarized at the same time as removing the exposed top of the conductor pillar 14 by using the CMP method etc. (FIG. 3A and FIG. 3B).

Figure 4B:
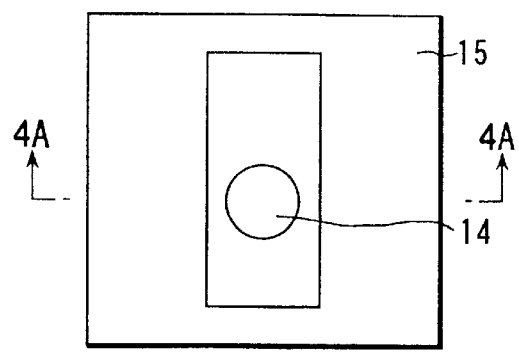

Next, the second wiring trench 16 of the same shape as the wiring pattern of the upper level wiring is formed on the surfaces of the second insulation film 15, for example, with the RIE method (FIG. 4A and FIG. 4B). When forming this trench, the trench is dug down to a depth being deeper than a depth to which at least a part of the conductor pillar 14 is exposed. Moreover, a step of cleaning the surface of the exposed conductor pillar 14 by using a CDE (Chemical Dry Etching) method, a wet etching method or a sputter-etching method with an inert gas etc. after forming the second wiring trench 16.

Next, an AlCu metal layer is formed on the second insulation film 15 and in the second wiring trench by using the sputtering method etc. The AlCu alloy is used in this explanation, but Al, AlSiCu, and Cu, etc. can be used for the metal layer. The metal layers other than the parts of the second wiring trench 16 are removed by using the CMP method and the CDE method, etc. after forming the metal layer, and then the upper level wiring 18 which is the second wiring is formed (not shown).

As described above, the problem of increasing contact resistance at the contact hole bottom and an excessive etching at the missaligned region since it becomes unnecessary to perform a dry etching for the contact hole opening which has been used in the conventional method of forming the contact hole according to the first embodiment. As a result, it becomes possible to form the multi-level wiring structure having an excellent electric characteristic and a high reliability.

Figure 5A:
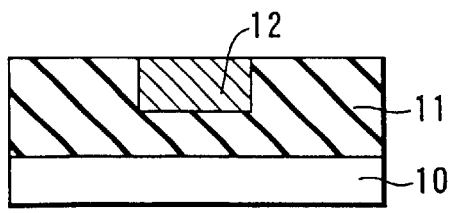
FIG. 5A to FIG. 5J are the manufacturing step sectional views of the semiconductor device according to the second embodiment of the present invention.
Figure 5B:
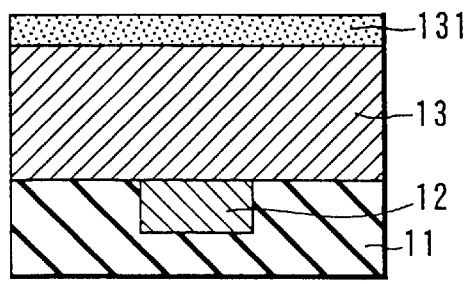
Figure 5C:
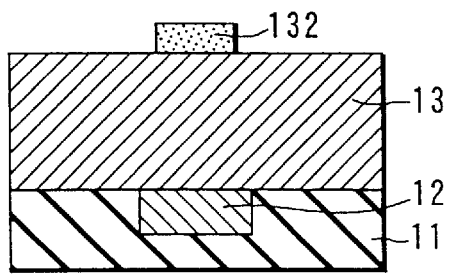
Figure 5D:
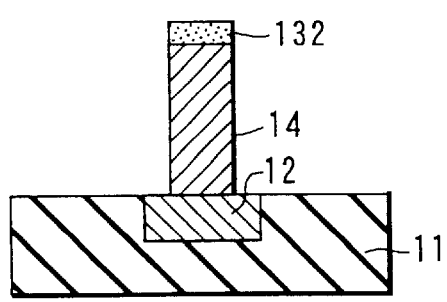
Figure 5E:
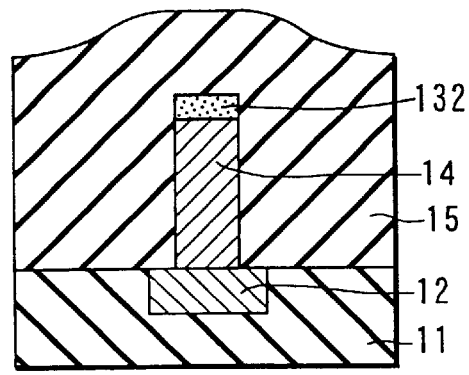
Figure 5F:
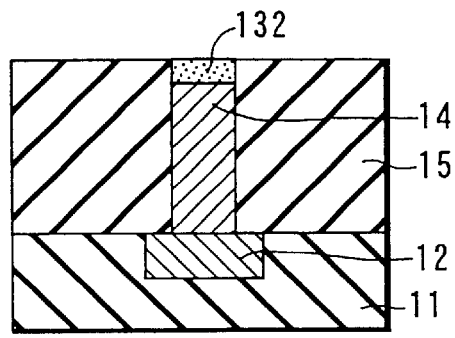
Figure 5G:
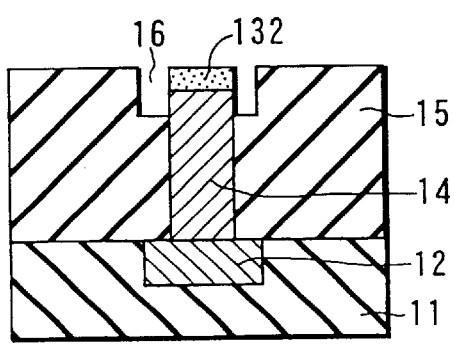
Figure 5H:
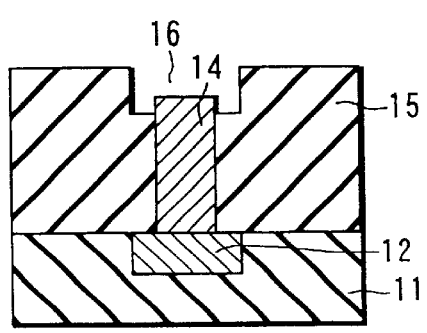
Figure 5I:
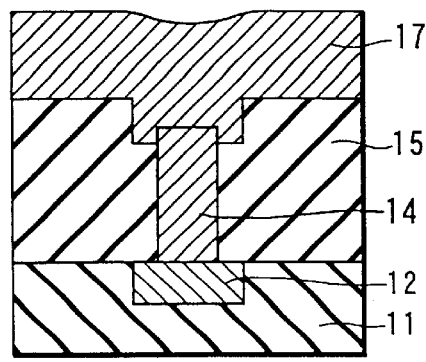
Figure 5J:
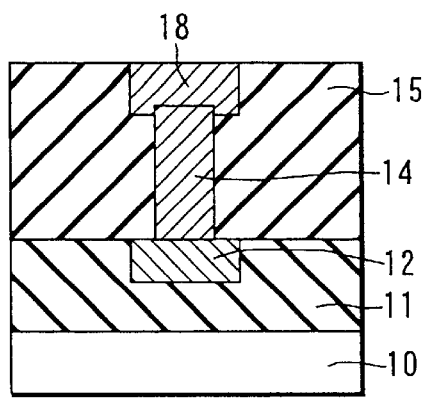
Figure 6:
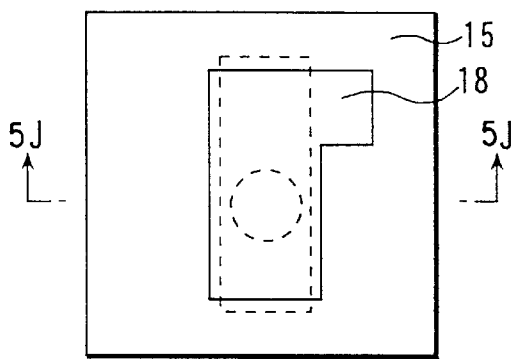
FIG. 6 is a plan view of the manufacturing step sectional vire of FIG. 5J.

The second embodiment will be s explained referring to FIG. 5A to FIG. 6.

The second embodiment is characterized by forming a hard mask on an upper surface of a conductive pillar which becomes a connection plug and improving the processing characteristics. FIG. 5A to FIG. 5J are manufacturing step sectional views of the semiconductor device. FIG. 6 shows a plan view of the manufacturing step sectional view shown in FIG. 5J. A semiconductor substrate 10, for example, which consists of the silicon semiconductor is shown in FIG. 5A and FIG. 5J, but is omitted in other figures.

First, a first insulation film 11, which consists of the silicon oxide film etc. formed by the CVD method etc., is formed on the semiconductor substrate 10. The surface of the first insulation film 11 is planarized, and the first wiring trench having the same shape as the wiring pattern of the lower level wiring is formed on the surface. And, a metal, which consists of for example the AlCu alloy, is buried in this first wiring trench, and then the lower level wiring 12, which is the first wiring, is formed (FIG. 5A). Next, the hard mask 131, which consists of silicon nitride film ($Si_3N_4$), is formed by using plasma CVD method etc. after AlCu metal layer 13 is formed on the first insulation film 11 and the lower level wiring 12 by the sputtering method etc. (FIG. 5B). Next, a photoresist (not shown) is patterned by using the photolithography method. The hard mask 131 of the silicon nitride film is patterned by, for example, the RIE method with the $CF_4$ faction gas system by using this photoresist as a mask, and the pattern is processed to a hard mask 132 (FIG. 5C). Subsequently, the AlCu layer 13 is processed to the conductor pillar 14 which consists of the metal and has a pillar-shaped structure by the RIE method using the $Cl_2$ gas system. The processing accuracy to the pillar shape of a comparatively thicker AlCu layer can be improved, as compared with the etching mask of the any photoresist, since the etching speed of the silicon nitride film to the $Cl_2$ faction gas is very small compared with the etching speed of AlCu (aluminum alloy). For example, in the pillar-shaped structure of 0.2 $\mu$m diameter, while the height, which can be manufactured when only the photoresist is used as the etching mask, is 4000 Å, a height more than 9000 Å can be achieved when a hard mask such as SiN is used.

A material used as the hard mask 131 may be a material which has a very low etching speed compared with an etching speed of the metal layer 13 during the etching of the metal layer 13, and is preferable to be able to be removed easily by the CDE method and the wet etching method as described later. For example, silicon oxide, silicon nitride, organic siloxane, inorganic siloxane, tungsten, C, niobium or niobium nitride, etc. may be enumerated as a material of the hard mask 131. Where, since the protection effect of the pillar sidewall by the etching reaction product can be expected when the AlCu pillar is processed in a case that the organic siloxane film which includes C film and C and another organic film voluminously are used as a hard mask, the processing accuracy of the AlCu pillar can be improved. Al, AlSiCu, and Cu, etc. may be used as the metal layer 13 (FIG. 5D). Next, the second insulation film 15 such as the silicon oxide films is formed by the CVD method or the spin coat method, etc. to bury the metal pillar 14 and the hard mask 132. The step where this second insulation film 35 is formed may be divided into several-steps, and a step of performing heat-treating etc. to perform the reforming of the insulation film may be added among them. The stacked structure of several kinds of different insulation films may be used as this second insulation film 15 (FIG. 5E). Thus, the second insulation film 15 is etched-back by the CMP method to planarize the difference after the second insulation film 15 is formed. At this time, the second insulation film 15 is etched-back until at least a part of hard mask 132 is exposed.

In addition, the hard mask 132 partially exposed to the surface of the wafer consists of the silicon nitride film, and therefore, can be used as an etching stopper at CMP of the second insulation film 15 such as the silicon oxide films (FIG. 5F). Next, the second wiring trench 16 is formed in the trench of the second insulation film 15 by the RIE method etc. to expose a top portion of the metal pillar 14 from which the hard mask 132 is covered (FIG. 5G). Subsequently, the hard mask 132 is selectively removed from the second insulation film 15 and the metal pillar 14 by using the RIE method or the CDE method. A step of cleaning surfaces of metal pillar 14 exposed in the second wiring trench 16 after this hard mask 132 is removed by using either of the CDE method, the wet etching method, the RIE method, and the sputter-etching method with the inert gas etc. may be added (FIG. 5H). Next, the AlCu metal layer 17 is formed on the second insulation film 15 and into the second wiring trench 16 by using the sputtering method etc. (FIG. 5I).

Thereafter, the metal layer 17 other than inside the second wiring trench is removed by using the CMP method etc., and the upper level wiring 18, which is the second wiring, is formed (FIG. 5J and FIG. 6).

By using the second embodiment, it becomes unnecessary to perform the dry etching which has been used in the conventional formation method to open the contact hole. Therefore, the problem of an increase of the contact resistance at the bottom of the contact hole and an excessive etching at the missaligned region, and it becomes possible to form the multi-level wiring structure with an excellent electric characteristic and a high reliability. Moreover, the processing of the pillar becomes easy and the processing accuracy improves to use the hard mask when the metal pillar is processed. In addition, it becomes possible to increase an accuracy of planarity, since this hard mask can be used as an etching stopper at a step of performing a CMP etch-back planarity of the insulation film, which is the step thereafter.

Figure 7:
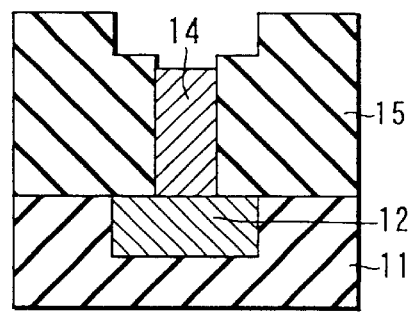
FIG. 7 shows another embodiment in the step of FIG. 5H.
Figure 8A:
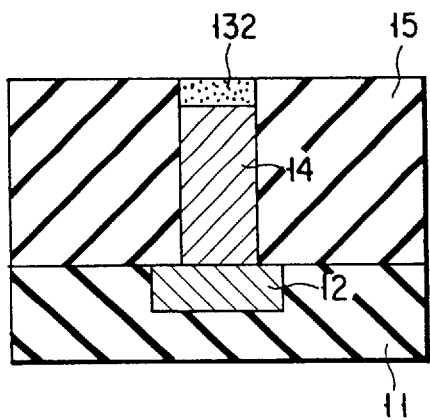
FIG. 8A to FIG. 8D show the case that there is the missalignment on the upper interface in the second embodiment.
Figure 8B:
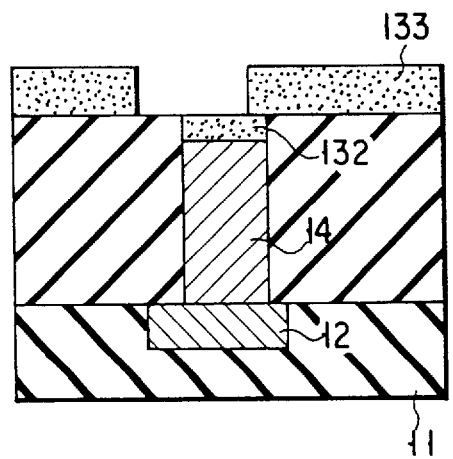
Figure 8C:
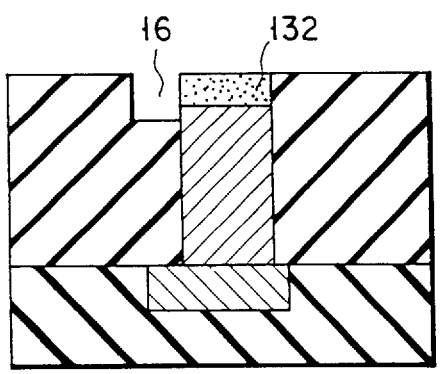
Figure 8D:
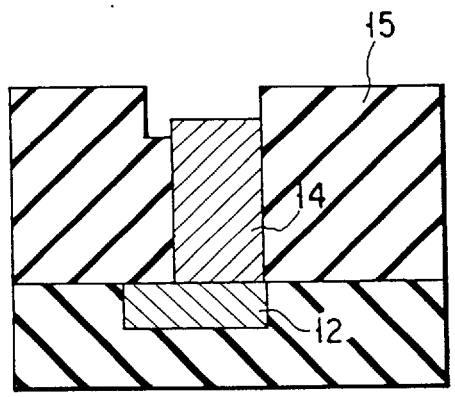

The second wiring trench 16 may be formed to an upper portion of the sidewall of the metal pillar 14 (on the way of hard mask 132), though an etching is performed to expose the sidewall of the metal pillar 14 when forming the second wiring trench 16 in the second above-mentioned embodiment. In this case, a structure when the hard mask is removed is shown in FIG. 7. FIG. 7 shows the same step to FIG. 5H. Other steps are the same procedures shown in FIG. 5A to FIG. 5J.

As described above, the protection effect on an upper surface of the pillar during the process is achieved, and the allowance of the difference of the depth of the second wiring trench 16 is enlarged by using the hard mask 132. In addition, it functions as an absorption layer to the missalignment when the process shown in FIG. 8A to FIG. 8D is used.

Therefore, it becomes possible to make the area on the upper surface of the pillar, which becomes electric contact surface, constant, even when the mask missalignment is caused between the upper wiring trench and the connection plug, and the difference of an electric characteristic can be reduced.

The third embodiment will be explained referring to FIG. 9A to FIG. 9H.

Figure 9A:
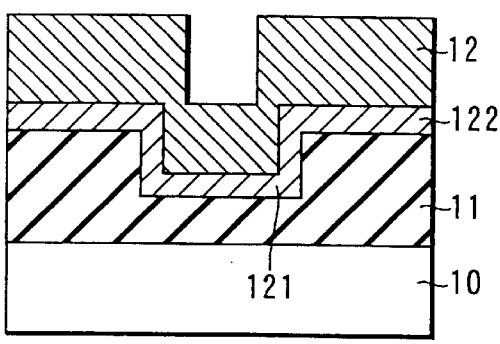
FIG. 9A to FIG. 9H (including FIG. 9F' and FIG. 9G') are manufacturing step sectional views of the semiconductor device according to the third embodiment.

FIG. 9A to FIG. 9H are manufacturing step sectional views of semiconductor device. The first interlevel insulation film 11, which consists of $SiO_2$ etc., is stacked on the semiconductor substrate 10 such as silicon. The silicon oxide film ($SiO_2$) of the film thickness of 500 nm by a spin-on method is used as the first interlevel insulation film 11. Next, the first wiring trench 121 is formed by a photolithography and an reactive ion etching (RIE). After the first wiring trench 121 is formed, PVD titanium nitride film 122 having about 5 nm thickness as a barrier metal, and PVD (physical vapor deposition) copper film 12 having about 800 nm thickness are deposited sequentially on the inner wall of the first wiring trench 121 (FIG. 9A). Next, a surplus part of titanium nitride film 122 and PVD copper film 12 are removed by the CMP method after the semiconductor substrate 10 is heat-treated in order to promote the Cu filling into the trench, and the lower level wiring 12 surrounded by the titanium nitride film 122 is formed into the first wiring trench 121.

Figure 9B:
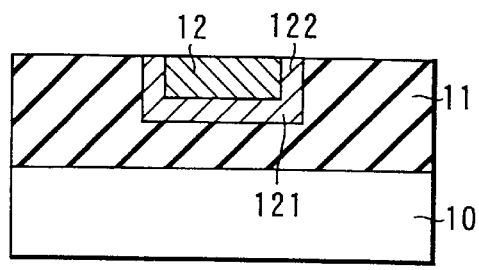
Figure 9C:
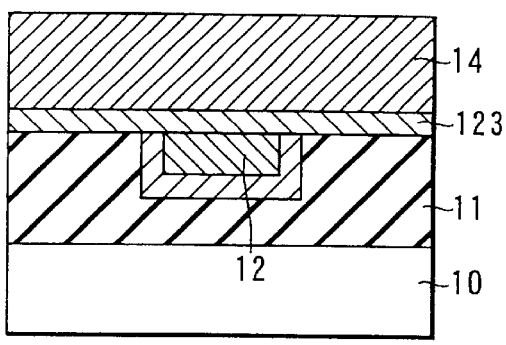

A method of depositing these materials is not especially limited and these are deposited by the sputtering method, here. The semiconductor element, the wiring, and the interlevel connection wiring, etc., which have already been formed under this wiring level, are omitted (FIG. 9B). The connection plug material is deposited on the first interlevel insulation film 11 by the sputtering method in the order of a W/WN film (barrier layer) 123 and an Al film 14 (film for metal pillar) (FIG. 9C). This barrier layer 123 is used for the diffusion prevention of copper, and additionally, used as a stopper for the prevention of an excessive etching when the metal pillar 14 is etched. In the present invention, the barrier layer 123 is not limited to this material. It is necessary to make the barrier layer two layers so that the copper, which is the material of the lower level wiring 12 in this embodiment, is not diffused when the lower level wiring 12 and the metal pillar 14 are different metals in the embodiment, but the barrier layer may have only one layer in case of the homogeneous metal. In that case, the barrier layer functions as a stopper for the excessive etching prevention when the metal pillar 14 is etched.

Figure 9D:
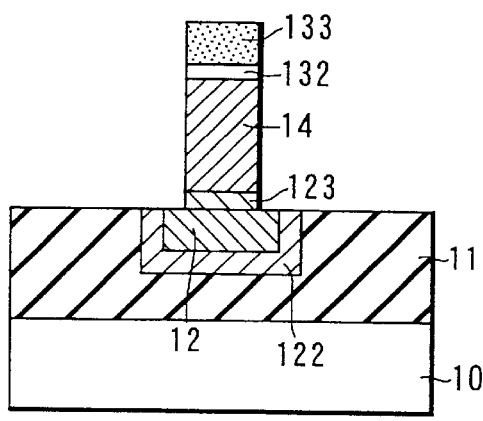

Next, the hard mask material 132 consisting of the silicon nitride film ($Si_3N_4$) is deposited on the connection plug material 123 and the metal pillar 14. After the photoresist 133 is coated on this hard mask material 132, the photoresist 133 is patterned to the connection plug shape by the lithography. Thereafter, the hard mask material 132, the metal pillar 14, and the barrier layer 123 are etched by RIE by making the patterned photoresist 133 the mask, the barrier metal layer (W/WN) 123 is arranged at lower portion, and then the metal pillar 14 covered with the hard mask 132 is formed. The CDE (Chemical Dry Etching) may be used only at the etching step of the W/WN film. A step of forming the connection plug as mentioned above is an almost similar to the second embodiment (FIG. 9D). Though barrier layer 123 is assumed to be W/WN here, WN/W and W/WN/W, etc. can be further applied. Though a hard mask is used in the third embodiment (including embodiments thereafter), in this embodiment, it is not always necessary. Therefore, though the embodiment, which uses a hard mask to give the allowance, is explained in the later embodiments from the third embodiment, it is possible to apply also to the embodiment by which the formation of a hard mask is omitted.

Figure 9E:
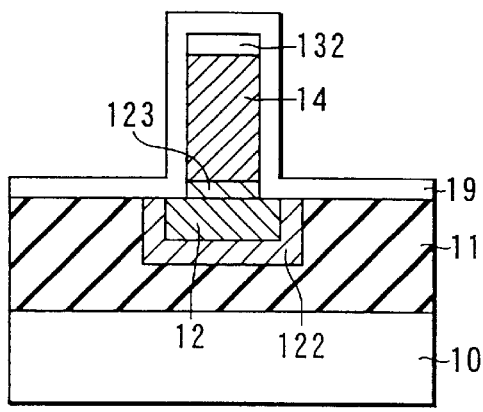
Figure 9F:
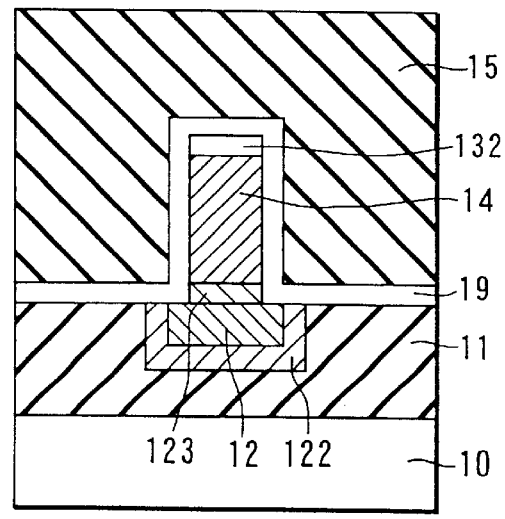
Figure 9F:
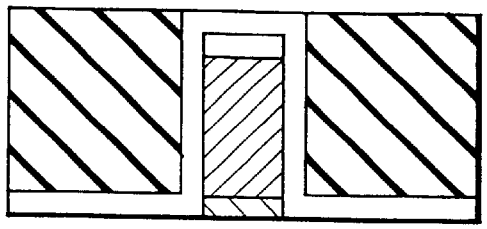

Next, the protection film 19, which consists of the silicon nitride film ($Si_3N_4$), having a function of controlling the diffusion of the copper and controlling the oxidation of wiring is deposited by the CVD method on the lower level wiring 12 (the first wiring) and metal pillar 14 which has the barrier metal layer 122 under it (FIG. 9E). Following this, the second interlevel insulation film ($SiO_2$) 15 is deposited by the CVD method to cover the metal pillar 14. At this time, the second interlevel insulation film 15 is deposited thicker than the metal pillars 14 to be able to form the trench for the second wiring at later step. And, the second interlevel insulation film 15 is planarized by the CMP (FIG. 9F). In FIG. 9E, the protection film 19 needs not be formed as a continuous film. For example, though details are described later, since the copper does not diffuse if the bottom of the metal pillar 14 is covered so that the space between the metal pillar 14 and the protection film 19 is not formed as shown in FIG. 10; the protection film 19 may not be formed to the sidewall of the metal pillar 14 and the protection film 19 at the sidewall of the metal pillar 14 may be thinner than the protection film 19 at the bottom even if the protection film 19 is formed to the sidewall of the metal pillar 14. However, when the copper is applied as a main material of the metal pillar 14, it is necessary to form the protection film 19 having a proper thickness as for the sidewall of the metal pillar 14.

Figure 9G:
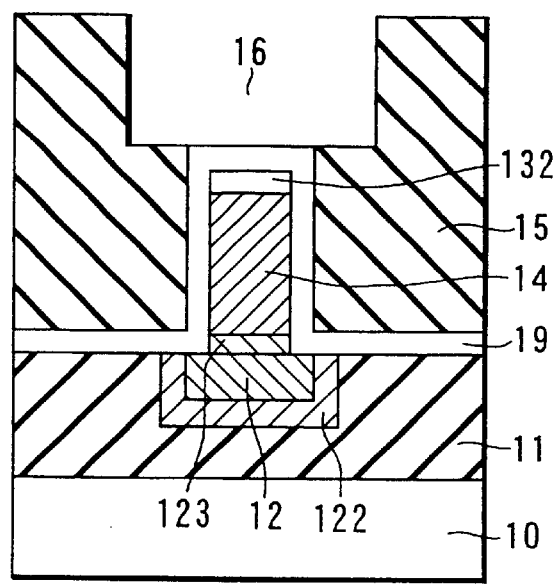
Figure 9G:
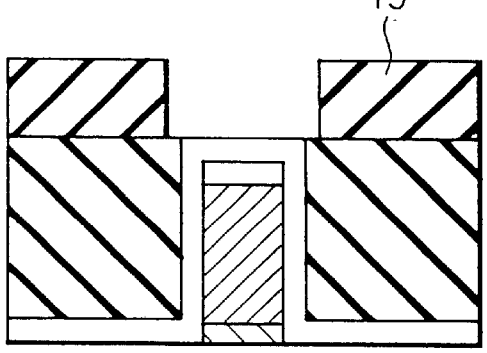
Figure 9H:
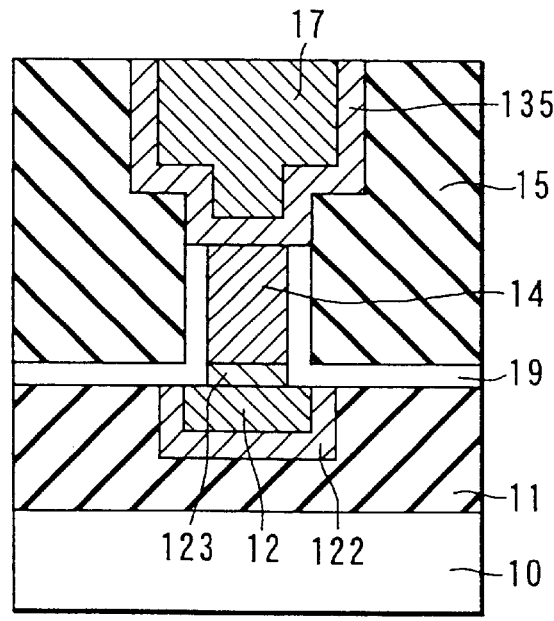

Next, the second wiring trench 16 is formed in a usual method. At least a part of the protection film 19 is exposed on the bottom of this wiring trench (FIG. 9G). The protection film 19 exposed to the inner bottom surface of the second wiring trench 16 formed in the second insulation film 15 and the hard mask 132 thereunder are etched and removed, a titanium nitride film (TiN) 135 of about 10 nm as a barrier layer is formed by using the PVD method, the copper film 17 is buried as a wiring material and is used as the upper level wiring 17, and a surplus part is polished by the CMP method and the interlevel insulation film 15 is made flat (FIG. 9H).

Since the protection film which consists of the silicon nitride film with the Cu diffusion prevention effect and the oxidation control effect is deposited on the lower level wiring and the step of the contact hole opening in the interlevel insulation does not exist in order to form connection plug by the above-mentioned method, an excellent connection can be obtained without requiring a complex process. In addition, the protection film which consists of the silicon nitride film deposited on the connection plug also has a function which enlarges the difference allowance in the depth direction when the second wiring trench is processed with the hard mask described in the second embodiment.

The first modification of the third embodiment will be explained. In the third embodiment, in the step of FIG. 9G and FIG. 9H, the protection film 19 and the hard mask 132 are removed by the etching and the metal pillar 14 is exposed after the second wiring trench 16 is formed and the protection film 19 is exposed.

In the first modification, the second interlevel insulation film 15 is planarized to expose the protection film 19 for example by the CMP method as shown in FIG. 9F'. Thereafter, the third interlevel insulation film 15' is deposited on the upper portion thereof, and the mask material is formed on the third interlevel insulation film 15'. And, the second wiring trench 16 is formed, and the protection film 19 and the hard mask 132 are removed. Other processings are similar to the third embodiment. Therefore, the different material may be used to the interlevel insulation films 15 and 15' in this case. For example, $SiO_2$ formed by the CVD or the spin-on method as the second interlevel insulation film can be used. For example, stacking of the interlevel insulation films having different permittivity becomes possible according to the first modification.

The second modification of the third embodiment will be explained referring to FIG. 11A to FIG. 1C. As shown in FIG. 11A, after forming the lower level wiring, the upper portion is removed by the etching. Thereafter, the barrier layer 123 (Hereinafter, called as a cap) is deposited and to be a stopper layer (FIG. 11B). And, the surface is made flat for example by the CMP method (FIG. 11C). Thereafter, since a step of forming the pillar-shaped structure is similar to the third embodiment, an explanation will be omitted. Then, the second interlevel insulation film 15 is formed without forming the protection film 19 shown in the third embodiment in this case. Since the following steps are the same as the third embodiments, the explanation will be omitted. In the second modification, the barrier layer 123 is used as a stopper layer and the Cu is prevented from diffusion by preventing contact directly with an upper level without forming the protection layer 19. Therefore, it is unnecessary to form the protection film 19. This effect is as follows. The protection film 19 is basically formed with SiN. However, an operation speed becomes slow since SiN has a high permittivity. However, it has an advantage that the operation speed becomes fast compared with the third embodiment according to this modification since there is no protection film 19.

The third modification of the third embodiment will be explained. The third modification is characterized in that a cap is provided like as the second modification in the first modification. An advantage in this case is similar to the second modification.

Figure 13A:
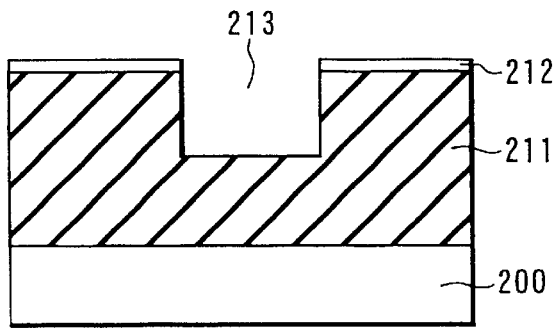
FIG. 13A to FIG. 13F are manufacturing step sectional views of the semiconductor device according to the fourth embodiment.
Figure 13B:
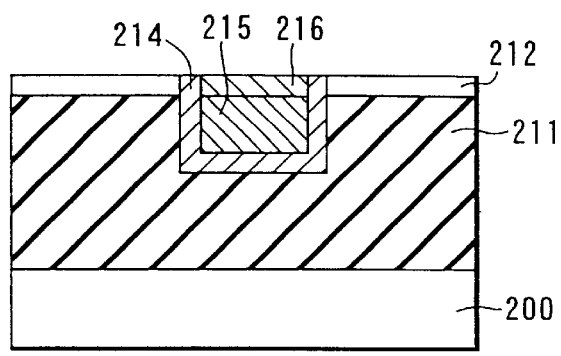
Figure 13C:
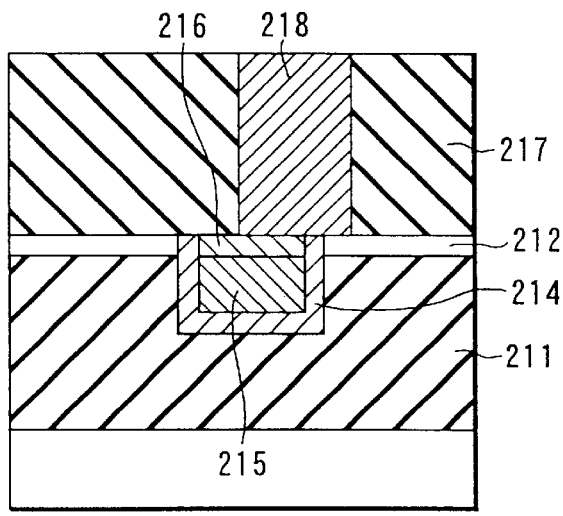
Figure 13D:
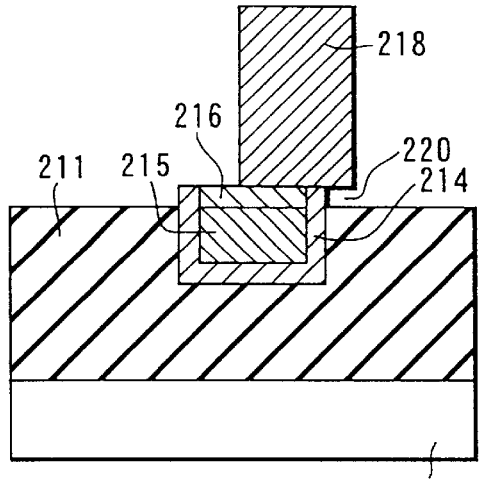

The fourth embodiment will be explained referring to FIG. 12 to FIG. 13F.

A step by which the metal pillar 14 is formed on the lower level wiring 12 with a state of having formed the lower level wiring 12 on the interlevel insulation film 11 on the semiconductor substrate 10 will be explained referring to FIG. 12. There are various methods in the step by which the connection plug is formed to the pillar-shaped and the method of using an electroless deposition will be described here.

The pattern which corresponds to the connection plug is formed on the interlevel insulation film 11 by the photoresist. A copper layer is grown by the electroless deposition in which a surface of the lower level wiring 12 is used as a plating generation nucleus in the contact hole which becomes a connection plug. Thereafter, the pillar-shaped structure of copper is formed as the metal pillar 14 when stripping off the photoresist by the organic solvent. Then, the metal pillar 14 and the interlevel insulation film 11 are coated by the protection film 19 such as the silicon nitride films. In addition, the interlevel insulation film 15 which consists of $SiO_2$ is formed by the spin-on method on the surface of the semiconductor substrate 10 and the trench for the upper level wiring is formed on the upper portion thereof. The titanium nitride film (TiN) 135 of about 10 nm is formed by using the PVD method to this wiring trench as a barrier layer, in addition, the copper film 17 is buried as a wiring material, and a surplus part is polished by the CMP method and is planarized.

A series of steps in which connections between the wirings are performed based on the fourth embodiment is explained above. As known well, the copper diffuses into the interlevel insulation film and causes the adverse effect to the device element. Then, it is necessary to cover all surfaces of the copper by the diffusion control film (barrier layer) and the protection film. However, all contact surfaces of the interlevel insulation film 11 and the metal pillar 14 can not be covered with the structure to pass the step shown in FIG. 12. This occurs remarkably when an missalignment without alignment allowance is performed in the lithography step of the metal pillar 14 (part of 13 of FIG. 12). Then, in the substrate in which a practical step is passed, the copper leaks and diffuses in the part 13 because of the alignment shift (It is known that copper diffuses into the interlevel insulation film such as silicon dioxide films by thermal and the electric field and causes deterioration in the device characteristic, and it is important to cover with the diffusion control film).

Next, the manufacturing steps of the semiconductor device of the fourth embodiment will be explained referring to FIG. 13A to FIG. 13F. The first interlevel insulation film 211 and the sacrifice film 212 which consist of $SiO_2$ etc. are stacked on the semiconductor substrate 200 such as silicon one by one. The sacrifice film 212 may be a thin film which consists of the silicon nitride film. Here, the silicon oxide film ($SiO_2$) of 500 nm in the film thickness by the spin-on method is used as the first interlevel insulation film 211. The silicon nitride film ($Si_3N_4$) of 20 nm in the film thickness with plasma CVD (Chemical Vapour Deposition) is used as the sacrifice film 212. The sacrifice film used in the present invention needs not be an insulation thin film, and, for example, may be a conductive thin film such as the carbons. Next, the first wiring trench 213 is formed by the photolithography and the anisotropy etching (RIE: Reactive Ion Etching).

The sacrifice film 212 may be used as a mask material of the etching in this step. That is, the sacrifice film 212 is processed by using the photoresist pattern as a mask, and in addition the first interlevel insulation film 211 is processed by using the sacrifice film 212 as a mask. A flexibility of the etching condition used to process the first interlevel insulation film 211 is secured by this method. That is, the photoresist may be transformed or disappeared during processing (FIG. 13A). The PVD titanium nitride film 14 which is about 5 nm and the PVD copper film 215 which is about 800 nm are deposited one by one on the inner wall of the first wiring trench 213 as a barrier metal to become the lower level wiring, after the first wiring trench 213 is formed, and a surplus part is polished and removed by the CMP. In addition, the tungsten film 216 is deposited on the surface of the copper by the CVD method in 5 nm as a protection film by the selective growth. When the lower level wiring 215 is aluminum, this film is unnecessary (FIG. 13B).

The photoresist 217 is formed on the first interlevel insulation film 211 and the sacrifice film 212 where the copper film 215 which becomes the lower level wiring arranged is buried, and the contact hole for the connection plug is formed to the photoresist 217. The film thickness of the photoresist 217 is finally decided in consideration of the necessary height of the connection plug. The film thickness is assumed to be 800 nm here.

Thereafter, the copper is plated by using the electroless deposition liquid which has the sulfuric acid copper to be a principal component and uses formalin as a reducer. The electroless deposition is selective film growth basically on the metal, it grows up to the metallic part (tungsten film 216) exposed to the bottom of the opening of the photoresist 217, and the contact hole is buried by plating. Though there is a case the copper is formed in an undesired region as a nucleus of the defect and dust, etc. on photoresist 217, the particle of this undesired copper can be excluded by CMP and wet processing (FIG. 13C).

Next, the connection plug 218 is formed by plating the copper which buries the contact hole when stripping off the photoresist 217 by the organic solvent. In addition, the exposure part of the silicon nitride film which is the sacrifice film 212 is etched isotropically by the down stream etching. The cave 220 is formed under portion of the connection plug 218 with this step. Under such a condition, the tungsten film 219 is deposited in about 5 nm by the selective growth CVD on the whole exposed connection plug 218, and is made to the protection film 219 used as a control film of the Cu diffusion or an oxidation control film. Naturally, the protection film 219 is formed in the cave 220 (FIG. 13D).

Figure 13E:
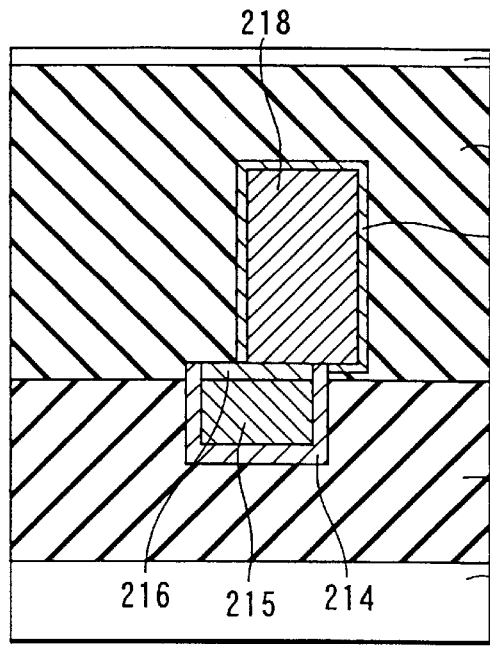
Figure 13F:
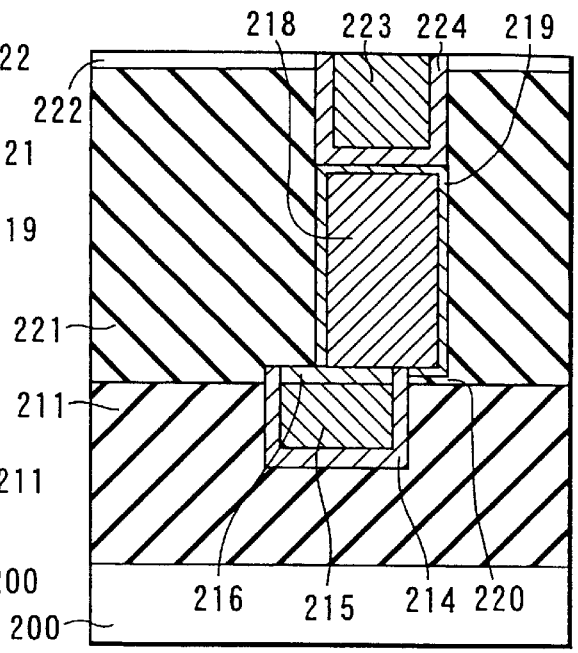

In addition, the second interlevel insulation film 221 of the film thickness of about 800 nm is formed with a spin-off method on the first interlevel insulation film 211 to bury the connection plug 218, and the third interlevel insulation film 222 which consists of $Si_3N_4$ of film thickness of about 20 nm thereon is formed with the plasma CVD method (FIG. 13E). When the connection plug which connects the upper level wiring with the further upper level wiring than the upper level wiring is formed, the third interlevel insulation film 222 is used, and performs the same functions as the sacrifice film 212 of FIG. 13A and FIG. 13B.

Next, the wiring trench for the upper level wiring on the upper portion of the interlevel insulation films 221 and 222 is formed. The titanium nitride film (TiN) 224 of about 10 nm is formed in this wiring trench as a barrier layer by using the PVD method, in addition the upper level wiring 223 which consists of the copper film is buried and formed as a wiring material, and a surplus part is polished and removed by the CMP method. As described above, the protection film 219 is formed in the cave 220 (FIG. 13F). Hereinafter, usual steps are used until the device is formed.

An explanation of a series of steps as described above. Since the Cu used for the wiring material (especially, connection plug material) is covered enough with the protection films such as the diffusion control films and the oxidation control films, the adverse effect is never caused for the device by diffusing in the interlevel insulation film, and, it is controlled that Cu is oxidized.

Various materials used in this embodiment, the replacement by a proper material is possible as long as it does not deviate from the purpose of the present invention. Steps on the step of which the tungsten film 216 where the selective growth is performed for example as a protection film on the surface of the copper, etc may be omitted. In this case, the tungsten 219 can be also formed to be simultaneously extended on the surface of the lower level wiring 215, when the selective tungsten 219 formed on the surface of the connection plug 218 is formed. The formation method is not limited to the selective growth CVD, a variety of formation methods like a method in which a metal thin film is formed with non-selection, thereafter causes the alloy reaction with copper, and is left only in the contact part with the copper, and methods in which the selective growth of the metal film is performed by the electroless deposition, etc. are possible.

The copper film may be thoroughly formed with the PVD for example, and processed to the pillar-shape by the lithography and the anisotropy etching, though in the formation of the connection plug 218, the copper is formed by using the electroless deposition in which the photoresist mask is used in the third embodiment.

Next, the fifth embodiment will be explained referring to FIG. 14A, FIG. 14B, and FIG. 15.

Figure 14A:
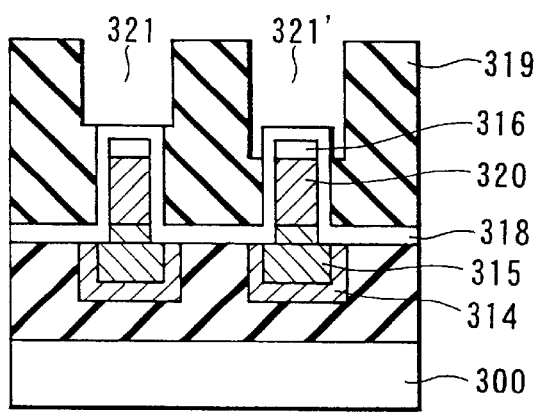
FIG. 14A and FIG. 14B are the manufacturing step sectional views of the semiconductor device according to the fifth embodiment.
Figure 14B:
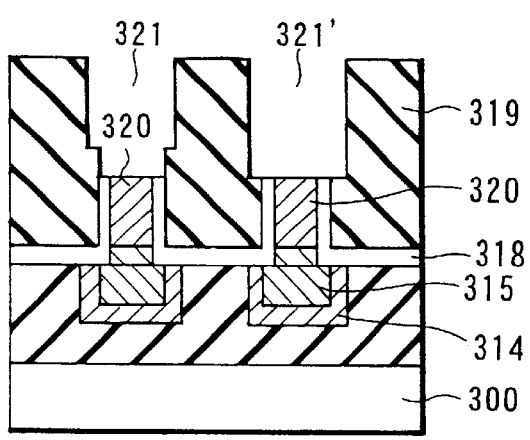

FIG. 14A and FIG. 14B are the manufacturing step sectional views of the fifth embodiment. FIG. 15 is a manufacturing step sectional view in a case that there is a difference in the depth direction of the wiring trench but is not followed the fifth embodiment. The fifth embodiment has the feature in using the thickness of stacking the silicon nitride films used for a protection film and a hard mask deposited on the upper surface of the connection plug as depth processing allowance of the trench processing for the second wiring performed thereafter, after the protection film which consists of the silicon nitride film where there are the Cu diffusion control effect and the oxidation control effect is deposited on the connection plug.

The fifth embodiment is the same as the fourth embodiment until the second interlevel insulation film is formed (that is, it is the same as the third embodiment to FIG. 9F).

The etching of the silicon oxide film (SiO$_2$) of the second interlevel insulation film 319 is stopped at a position where the protection film 318 of the silicon nitride film is exposed without etching to the surface of connection plug 320 when the second interlevel insulation film 319 is etching-processed and the trench 321 for the second wiring is formed (FIG. 14A). Thereafter, the etching is advanced again in a condition of which an etching speed of the silicon nitride film is much larger than that of the silicon oxide film and the surface of connection plug 320 is exposed (FIG. 14B). Thereafter, the upper level wiring (barrier layer 322 which consists of TaN and copper layer 323) which is the second wiring is formed in this wiring trench 321. The depth difference of the trench 321 for the second wiring in taken the above-mentioned steps can be absorbed by the thickness of the silicon nitride films 316 and 318. In FIG. 15, since the second interlevel insulation film 319 is etched to expose the pillar sidewall in a right trench, it is drawn that the protection film of an upper portion of the pillar is left and the protection film at the sidewall of the pillar is removed. However, a part of the protection film in the sidewall actually remains without being completely removed occasionally (followings are same).

Next, the sixth embodiment will be explained referring to FIG. 16A and FIG. 16B.

FIG. 16A and FIG. 16B are sectional views of the semiconductor device. In the fifth embodiment, it is processed to the shape of the skirt extension (FIG. 16A) in the part of the vicinity of the joint section or a structure (FIG. 16B) of steps (part in barrier layer 416) in the lower direction which has extended for the coverage improvement of the protection film 418 which consists of the silicon nitride film having the Cu diffusion control function or the oxidation control function in the vicinity of the joint section with the lower level wiring 415 which consists of the connection plug 420 and the Cu. In any case, the protection film 418 becomes possible to cover this part enough. That is, the coverage of the protection film 418 in the connection plug 420 and the parts other than the contact section with the lower level wiring 415 thereunder is improved and the reliability can be improved.

The barrier layer 416 has a shape of the skirt extension or a step structure in the sixth embodiment to improve the coverage. However, it is not limited to this, and a structure that the connection plug 420 is broadened at the lower section, for example. In that case, a structure may be a structure that the cross-section of the connection plug 420 increases from the upper section to a lower section or may be a structure of the skirt extension.

Next, the seventh embodiment will be explained referring to FIG. 17A to FIG. 18.

FIG. 17A to FIG. 18 are sectional views of the semiconductor device which has various shapes of the protection films. The protection film 518 which consists of the silicon nitride film having the Cu diffusion control function or the oxidation control function in the vicinity of the joint section with the lower level wiring 515 which consists of Cu has the Cu diffusion control effect if the protection film 518 is deposited on the interlevel insulation film 511 and the lower level wiring 515 which consists of Cu. In this case, the Cu diffusion control effect is irrespective of the manner of depositing the protection film 518 of the connection plug 520. For example, in FIG. 17A, the protection film is thinly deposited on the side of the connection plug 520, and is thickened thoroughly than other parts. If the protection film 518 is deposited on the lower level wiring 515 and the near first interlevel insulation film 511, a part of the protection film 518 deposited on the first interlevel insulation film 511 may be removed if necessary (FIG. 17B). In FIG. 18, the protection film 518 is thinly deposited on the connection plug 520, and thickly deposited on the interlevel insulation film 511. Thus, the method of forming the protection film 518 can be variously modified, and if the diffusion prevention of the Cu can be performed besides the deposition method of the seventh embodiment, the protection film may be formed in any structure.

Figure 19A:
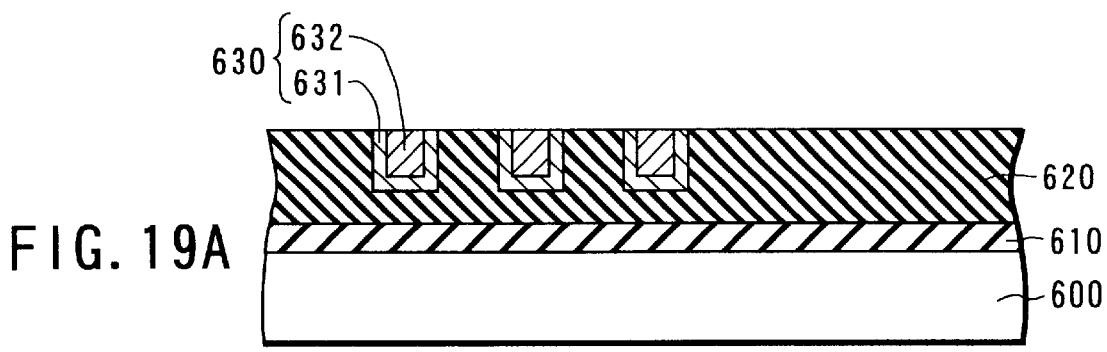
FIG. 19A to FIG. 19C are step sectional views sequentially showing the steps regarding to the manufacturing method according to the eighth embodiment of the present invention.
Figure 19B:
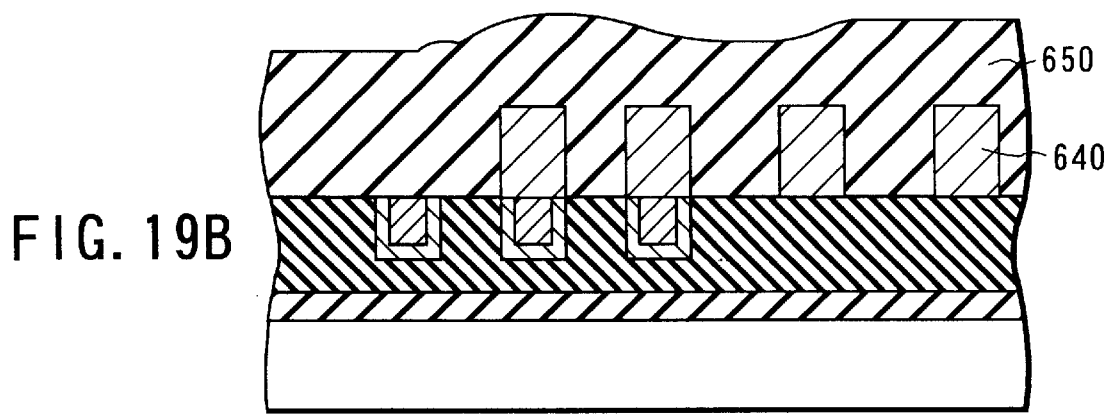
Figure 19C:
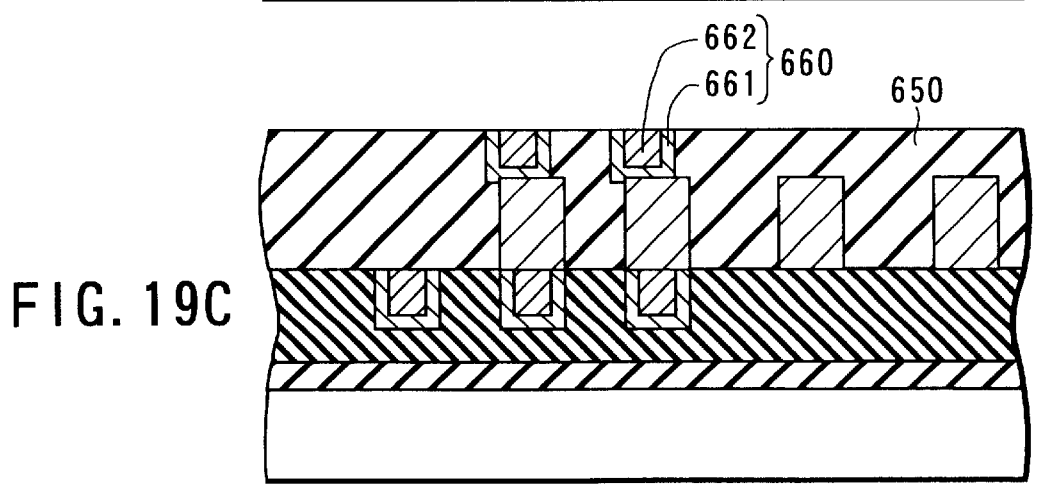

FIG. 19A to FIG. 19C are step sectional views which show the manufacturing method according to the eighth embodiment of the present invention. In the step chart shown in FIG. 19A to FIG. 19C, the element isolation and the MOSFET, etc. are omitted, and a step according to the logical arithmetic processing of generating the dummy pattern and the formation of multi-level metal wiring (a Double-Level-Metal: DLM) having two layers.

First, the low permittivity film 620 is formed on the semiconductor substrate 600 such as the silicon substrate through the insulation isolation layer 610 as shown in FIG. 19A, and thereafter the metal wiring (lower level wiring 630) on the lower level side which consists of the high melting point metal film 631 and the metal film 632 is formed. In the eighth embodiment, a case that the burial type Al-Cu alloy metal wiring (Al-Cu Damascene) is used as the lower level wiring 630 will be explained.

First, the low permittivity film 620 in which a ratio permittivity k value is 3.9 or less is formed on the semiconductor substrate 600 through the insulation isolation layer 610. Some materials and the formation methods may be considered for this low permittivity film 620. For example, the low permittivity film 620 can be formed by forming the silicon oxide film to which fluorine (F) or boron (B) is added by the low pressure plasma CVD method. A silicate system film and the a polymer system film formed with the spin-on method can be used. Both an organic system film which includes an organic component and an inorganic system film which does not include an organic component can be used for a silicate system film. Additionally, the organic system film obtained by the deposition polymerization method can be used. Since the insulation film in which a low permittivity is not necessary exists according to the semiconductor device, the $SiO_2$ film by the CVD method generally used and the BPSG and the PSG film, each of which contains boron (B) and phosphorus (P), etc. may be used for these insulation films. In the seventh embodiment, it is assumed the organic SOG film formed with the coating method is used as a low permittivity film. In this case, after the organic SOG (spin-on glass) is coated in the film thickness of 0.5 $\mu$m as the film thickness corresponding of the lower level wiring 630, a heat-treatment is performed at 450° C., and the organic SOG is stiffened and is stabilized.

The trench is formed to the organic SOG film 620 with the lithography and the RIE after above-mentioned organic SOG film 620 is formed, and the metal material which becomes the lower level wiring is filled to the trench. For example, after depositing the titanium nitride film 14a (TiN film) of 10 nm which has a high melting point metal by the method of sputtering, the Al-Cu alloy film 632 of 0.6 $\mu$m is deposited at 450° C. as this filling step. Thereafter, a surplus metal outside the trench is removed by the chemical mechanical polishing (CMP), the surface is planarized, and the lower level wiring 630 buried in the trench is formed. Thus, the structure shown in FIG. 19A is obtained.

Next, a step by which the pillar 640 and the interlevel insulation film 650 are formed as shown in FIG. 19B is performed.

Though the pillar is formed only at portions which become the contact and via hole in the conventional art, it is enabled to avoid the problem of the resolution because the lithography of the hole pattern need not be performed by forming the pillar. However, the pattern density of the contact hole and the via hole in the semiconductor device and, in other word, pattern density of the pillar are extremely small with less than about 5%, and the phenomenon that the low density pattern of the pillar is excessively etched by the step in which the pillar is processed to the pillar-shaped after the lithography is occurred. When the interlevel insulation film is deposited to planarize after the pillar is formed, the pattern dependency becomes large and the planarity characteristic is deteriorated. Therefore, the planarity changes according to the difference of a standard pattern density of the local region standardized at several hundreds $\mu$m region. That is, the problem that the film thickness of the interlevel insulation film becomes thick in the part where a standard pattern density of the local region is high, and the film thickness of the interlevel insulation film thins in the part where a standard pattern density of the local region is low occurs. Especially, when the interlevel insulation film is formed by using the formation technique of the coating (spin-on) type, this influence is large.

Then, to solve such a problem, the dummy pattern which has a supplementary role of the manufacturing process is generated based on the design information of the semiconductor device by the logical operation processing, and a standard pattern density at a local region and the pattern density to the entire semiconductor device are increased by arranging this dummy pattern, that is, the dummy pillar.

Figures 20, 21:
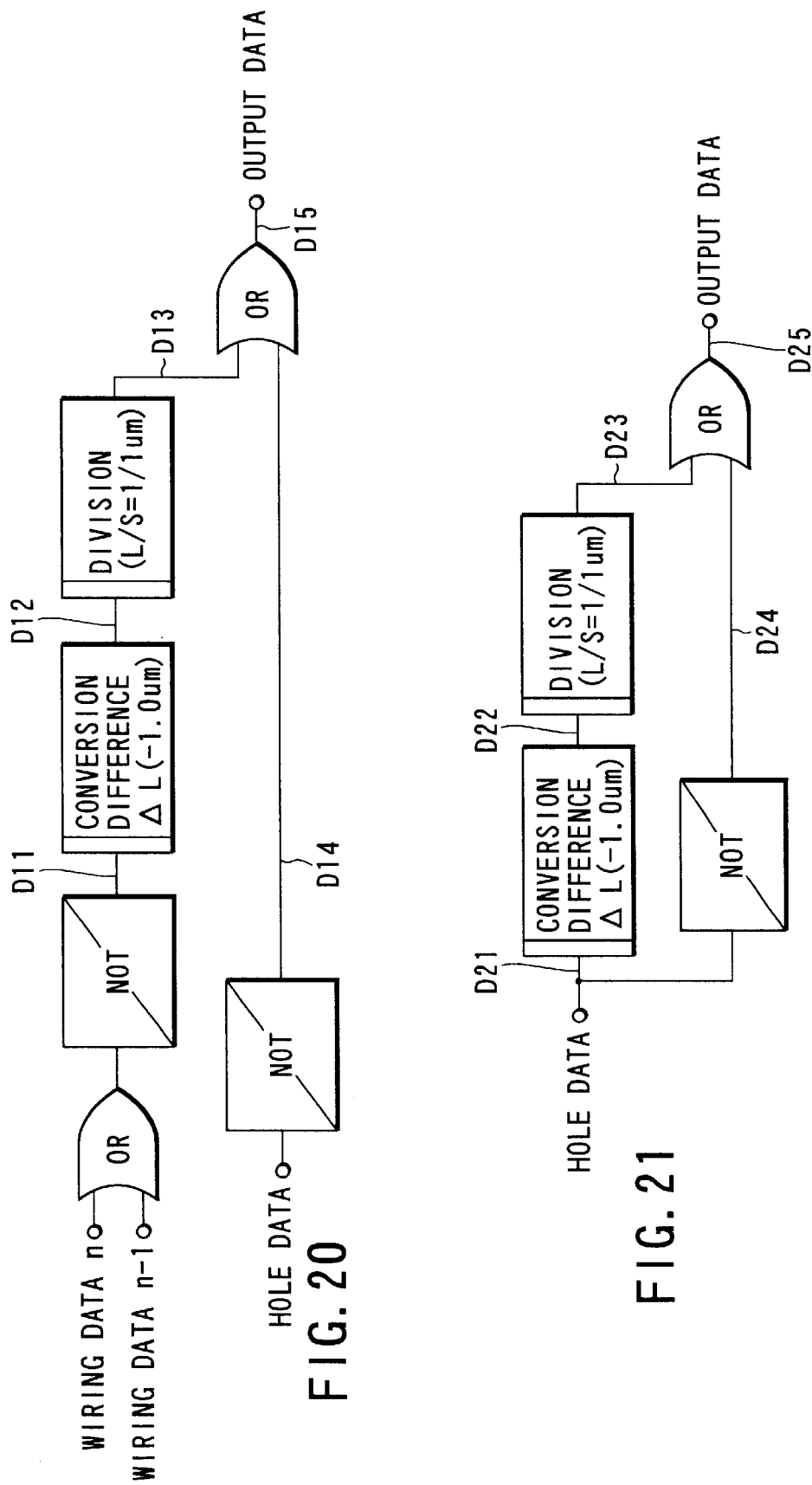
FIG. 20 shows the generation procedure of the mask data to form the pillar in the eighth embodiment of the present invention.
FIG. 21 shows the generation procedure of the mask data to form the pillar in the ninth embodiment of the present invention.

The following arithmetic processings are performed in this embodiment, though some methods are considered to the above-mentioned logical operation processing. FIG. 20 is an explanation chart which shows the flow of this arithmetic processing, and, hereinafter, this arithmetic processing will be explained referring to FIG. 20.

First, based on the wiring data of the upper level wiring (n wirings) and the lower level wiring (n–1 wirings), the logical operation of NOR (NOR) is processed to data of these two layers. A data D11 of a region arranged neither the upper level wiring nor the lower level wiring is extracted by the arithmetic processing of the NOR. Next, the minus conversion difference (for example, $\Delta L=-1.0$ $\mu$m) is added to the extracted regions, and, the obtained data as a result is assumed to be D12. Thus, the region which is apart from the boundary at 1 $\mu$m or more in the region where at least one of the upper level wiring and the lower level wiring is arranged by providing the conversion difference of 1 $\mu$m for instance for a region which corresponds to the data D11 is extracted. In this processing, a region which a shorter side is 2 $\mu$m or less at a previous stage where the minus conversion difference is performed is deleted from the data D12. Next, an arithmetic processing in which a region corresponding to the data D12 is divided into an island-shape and extracted is performed, and the obtained data as a result is assumed to be D13. As for the division processing at this time, it is preferable in the essential connection pattern design rule used in this layer to divide into the united size. For example, the island-shaped pattern is assumed to a square in which one side is 1 $\mu$m, and an interval of adjacent island-shaped pattern with each other is assumed to be 1 $\mu$m.

Next, the arithmetic processing of the OR (OR) of data D14 obtained by a NOT of data of the essential connection hole pattern and data D13 obtained by the above-mentioned series of an arithmetic processing is performed, and, the obtained data as a result is assumed to be final data D15.

The method by which a similar result is obtained is variously considered concerning the procedure of the above-mentioned arithmetic processing by the logical conversion based on an exchange law $(X+Y=Y+X, X \cdot Y=Y \cdot X)$, coupling law $(X+(Y+Z)=(X+Y)+Z, X \cdot (Y \cdot Z)=(X \cdot Y) \cdot Z)$, distribution law $(X+Y \cdot Z=(X+Y) \cdot (X+Z), X \cdot (Y+Z)=X \cdot Y+X \cdot Z)$, absorption law $(X \cdot (X+Y)=X \cdot X+X \cdot Y=X)$, and de Morgan's theorem etc.

In the data D15 obtained as mentioned above, the pattern exists in both regions of the hole pattern section for an essential connection and the dummy pattern section obtained by the logical operation, and the resist remains in these regions at lithography. Therefore, the density of the pattern in the whole area of the semiconductor device can be increased. For example, the pattern density is 19% for a certain microprocessor.

Return to an explanation of steps of FIG. 19B, for example, Al-Cu film is deposited at a thickness (for example, 0.7 $\mu$m) larger than a depth of the via hole to the whole surface by the sputtering method. Subsequently, the pattern of the pillar is transferred to the resist by using the mask manufactured based on the data obtained by the arithmetic processing and the pillar 640 of the Al-Cu film is formed with the RIE by using the resist mask to which the pattern is formed by the lithography technology. Thereafter, after the organic SOG which becomes the interlevel insulation film 650 is coated at 1.1 $\mu$m thickness equivalent to a film thickness of the upper level wiring, heat-treating is performed at 450° C. and the organic SOG 650 is stiffened and stabilized.

Next, the interlevel insulation film 650 is planarized by using the CMP to remove the film thickness difference tuned to the arrangement of the ground pillar material 11 generated on the surfaces of the interlevel insulation film 650. Subsequently, the double level metal wiring structure as shown in FIG. 19C is manufactured by forming the upper level wiring 17 of the burial type which consists of TiN film 661, which is a refractory metal, and Al-Cu alloy film 662 similar to the formation of the lower level wiring 630 as previously explained.

The ninth embodiment of the present invention will be explained referring to FIG. 21 to FIG. 22A.

In the eighth embodiment, an example of leaving the formed pillar-shaped structure (pillar) as it is and connecting the upper level wiring directly with this is shown. When the pillar-shaped structure can be removed by the step thereafter, it is possible to simplify the processing of the logical operation of the dummy pattern generation more than the technique explained in the eighth embodiment. FIG. 21 is an explanation chart which shows the flow of this arithmetic processing, and, Hereinafter, an explanation will be made referring thereto.

First, the minus conversion difference (for example, $\Delta L=-1.0$ $\mu$m) is added to the hole data D21 which is a contact and/or a via hole which becomes a connection region of the upper level wiring (n wiring) and the lower level wiring (n–1 wiring), and, the obtained data as a result is assumed to be D22. In this case, the region apart from the boundary in the region where the connection region of the upper level wiring and the lower level wiring is arranged at 1 $\mu$m or more by providing the conversion difference of 1 $\mu$m for instance for the region which corresponds to the data D21 is extracted. In this processing, a region whose shorter side is 2 $\mu$m or less at a previous stage where the minus conversion difference is performed is deleted from the data D22.

Next, an arithmetic processing in which a region corresponding to the data D22 is divided into an island-shaped pattern and is extracted is performed, and the obtained data as a result is assumed to be D23. As for the division processing at this time, it is preferable in the essential connection pattern design rule used in this layer to divide into the united size. For example, the island-shaped pattern is assumed to a square in which one side is 1 $\mu$m, and an interval of adjacent island-shaped pattern with each other is assumed to be 1 $\mu$m.

Next, the arithmetic processing of the OR (OR) of data D24 obtained by a NOT of data of the essential connection hole pattern and data D23 obtained by the above-mentioned series of an arithmetic processing is performed, and, the obtained data as a result is assumed to be final data D25.

In the data D25 obtained as mentioned above, the pattern exists in both regions of the hole pattern section for an essential connection and the dummy pattern section obtained by the logical operation, and the resist remains in these regions at lithography. Therefore, the pattern density in the whole area of the semiconductor device can be increased. For example, the pattern density is 42% for a certain microprocessor.

Hereinafter, a manufacturing method using the above-mentioned logical operation processing will be explained referring to the step sectional views shown in FIG. 22A to FIG. 22F. These step charts omit the element isolation and MOSFET, etc., and mainly show the steps according to the processing of the logical operation of the dummy pattern generation and the formation of multi-level metal wiring (a Double-Level-Metal: DLM) which consists of two layers.

Figure 22A:
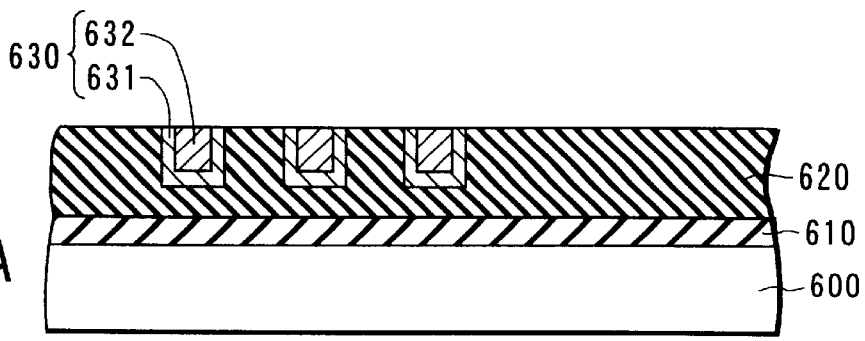
FIG. 22A to FIG. 22F are step sectional views sequentially showing the steps regarding to the manufacturing method according to the ninth embodiment of the present invention.

As shown in FIG. 22A, similar to the eighth embodiment, the low permittivity film 620 is formed on the semiconductor substrate 600 of the silicon substrate etc. through the insulation isolation layer 610, and thereafter the buried metal wiring (lower level wiring 630) on a lower side which consists of the refractory metal film 631 and the metal film 632 is formed.

Figure 22B:
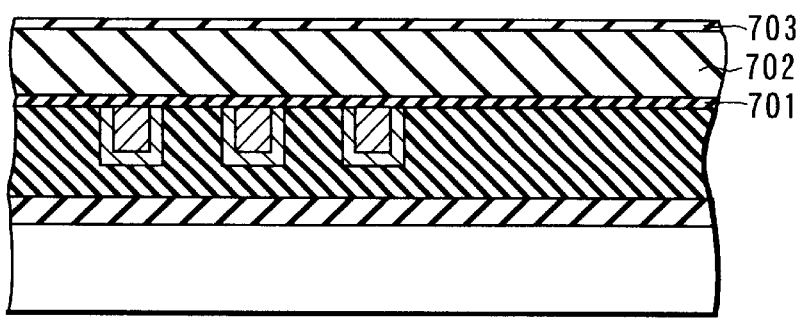

Next, as shown in FIG. 22B, an $SiO_2$ film of 5 nm in thickness is deposited by the low pressure plasma CVD method on the whole surface, subsequently, an HSQ (Hydrogen Silsesquioxane) 702 having the film thickness more than the depth of the via hole is deposited, and an $SiO_2$ 703 of 10 nm in thickness is deposited by the low pressure plasma CVD method.

Figure 22C:
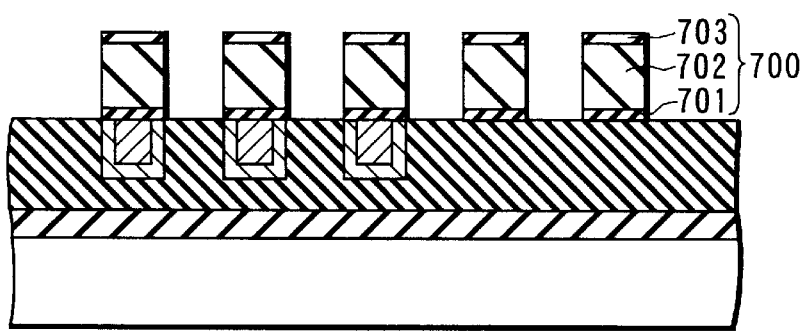

Next, the pattern is transferred to the resist by using the mask manufactured based on the data obtained by the above-mentioned arithmetic processing by the lithography technology. As shown in FIG. 22C, by using the formed resist pattern as a mask, the pillar 700 is formed by etching the stacking film which consists of the $SiO_2$ film 701, the HSQ film 702, and the $SiO_2$ 703 by the RIE technology.

Figure 22D:
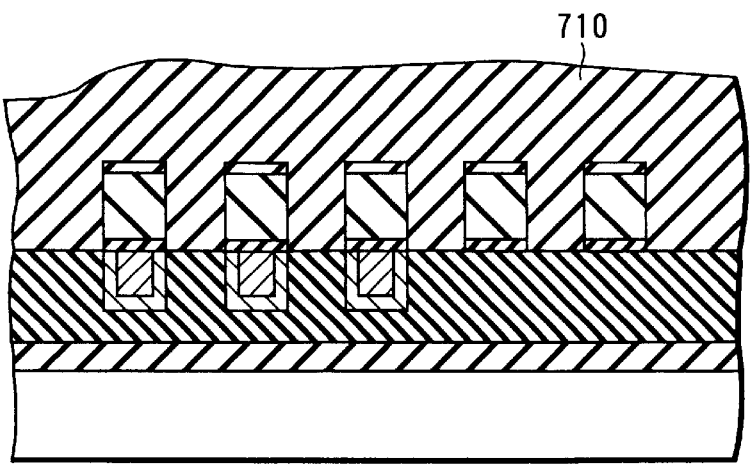

Thereafter, as shown in FIG. 22D, after the organic SOG which becomes the interlevel insulation film 710 is coated at 1.1 $\mu$m thickness equivalent to a film thickness of the upper level wiring, heat-treating is performed at 450° C. and the organic SOG 710 is stiffened and stabilized.

Figure 22E:
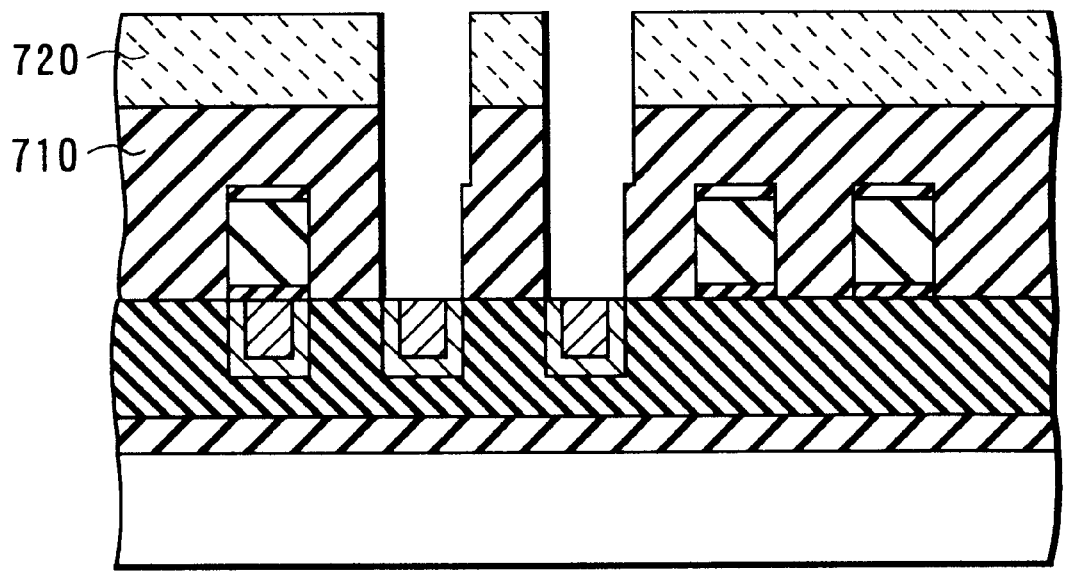

Next, the interlevel insulation film 710 is planarized by using the CMP to remove the film thickness difference tuned to the arrangement of the ground pillar material 700 formed on the surfaces of the interlevel insulation film 710. Thereafter, the resist pattern 720 to form an opening in the connection region of the lower level wiring and the upper level wiring is formed on the interlevel insulation film 710. Subsequently, this resist pattern 720 is used as a mask, and the interlevel insulation film 710 and the pillar 700 thereunder are removed. When the pillar 700 is removed, the $SiO_2$ film of upper portion is processed by the RIE using the gas, the HSQ film is removed by the diluted HF which is diluted to 1:100 or an alkali solvent, and a lower $SiO_2$ film is processed by the RIE using the gas including fluorocarbon. The structure of FIG. 22E is obtained by this step.

Figure 22F:
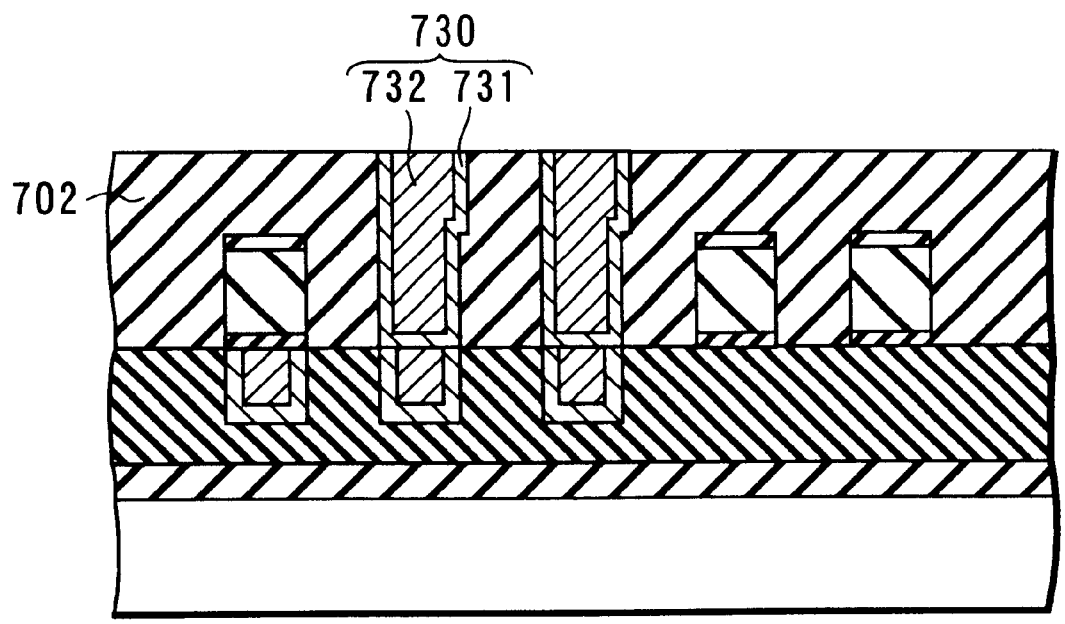

Thereafter, the DLM structure shown in FIG. 22F is manufactured by forming the upper level wiring 730 of the burial type which consists of TiN film 731 which is the high melting point metal and the Al-Cu alloy film 732.

In the eighth embodiment, by adopting the logical operation processing as previously explained, the pillar which becomes a dummy remains in the region where the lower level wiring and the upper level wiring are formed except the connected section of the lower level wiring and the upper level wiring. Therefore, it is preferable to used a low permittivity insulator as the pillar.

The tenth embodiment of the present invention will be explained referring to FIG. 24 to FIG. 25F.

The ninth embodiment is an embodiment to process without generating the dummy pattern for the predetermined specific region. That is, the dummy pattern is not generated to an undesirable region to form the dummy pattern (dummy pillar) in the circuit performance and the chip characteristic. In this case, the dummy pattern may be not generated for a specific region of all levels, or the dummy pattern may be not generated for only a specific region of a specific level. For example, the following regions may be provided as an example of a specific region where the dummy pattern is not generated like this.

First, the region where a sensitive circuit to the parasitic capacity caused by the interlevel insulation film, etc. are formed may be provided as a specific region. The region where the spare circuit section, the redundancy circuit section, and the fuse section arranged in the circuit section are formed may be provided. In addition, the regions where the region with which the terminal section (PAD section) for an external connection is formed and the dicing line section is provided may be provided as a specific region.

Specifically, for example, the dummy pattern may be generated for the region where the specific region is excluded from the dummy pattern obtained by the eighth embodiment or the ninth embodiment.

Figure 23:
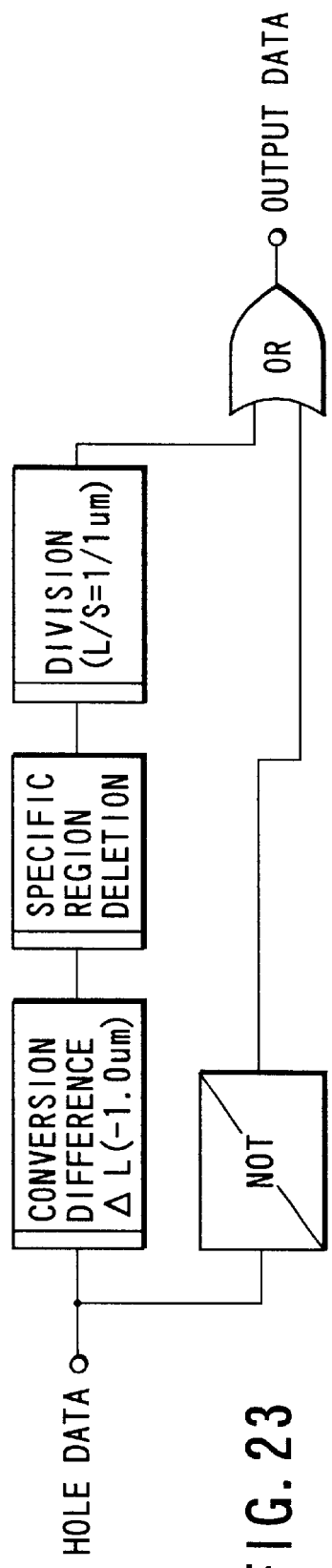
FIG. 23 shows the generation procedure of the mask data to form the pillar in the tenth embodiment of the present invention.
Figure 24:
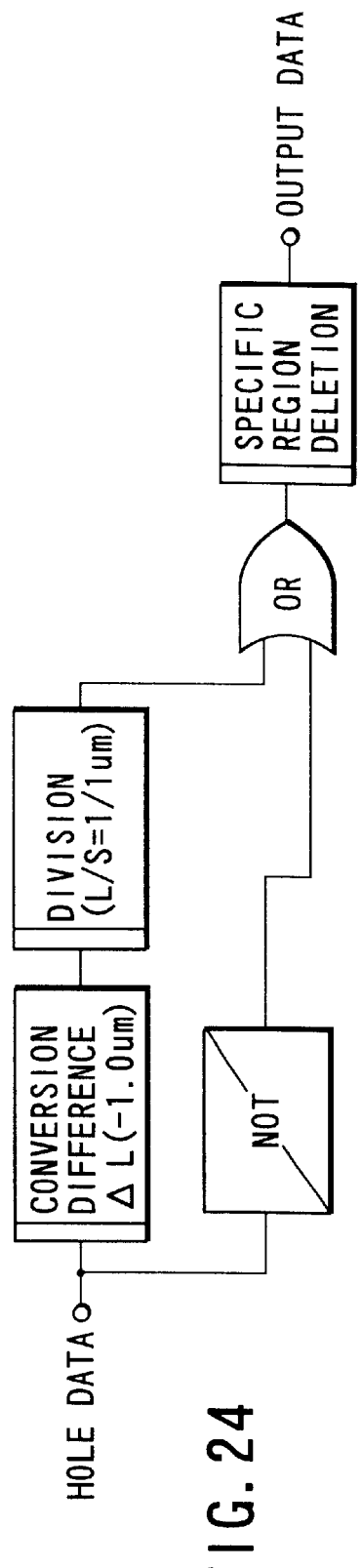
FIG. 24 shows the generation procedure of the mask data to form the pillar in the tenth embodiment of the present invention.

FIG. 23 and FIG. 24 are figures which show the flow of the arithmetic processing when the dummy pattern is generated for the region where a specific region is excluded from the dummy pattern obtained by the ninth embodiment. FIG. 23 shows an example for performing processing in which a specific region is removed after performing processing of subtracting the conversion difference ΔL, and FIG. 24 shows an example for performing processing in which a specific region is removed to the data obtained by the arithmetic processing shown in FIG. 21.

FIG. 25A to FIG. 25F are figures which show the step sectional views when the DLM structure is manufactured based on the data obtained by the arithmetic processing shown in FIG. 23 or FIG. 24. Steps of FIG. 25A to FIG. 25F correspond to the steps of FIG. 22A to FIG. 22F according to the ninth embodiment, respectively. Therefore, a detailed explanation for each step is referred to the ninth embodiment, and only a feature of this embodiment will be explained here.

Figure 25A:
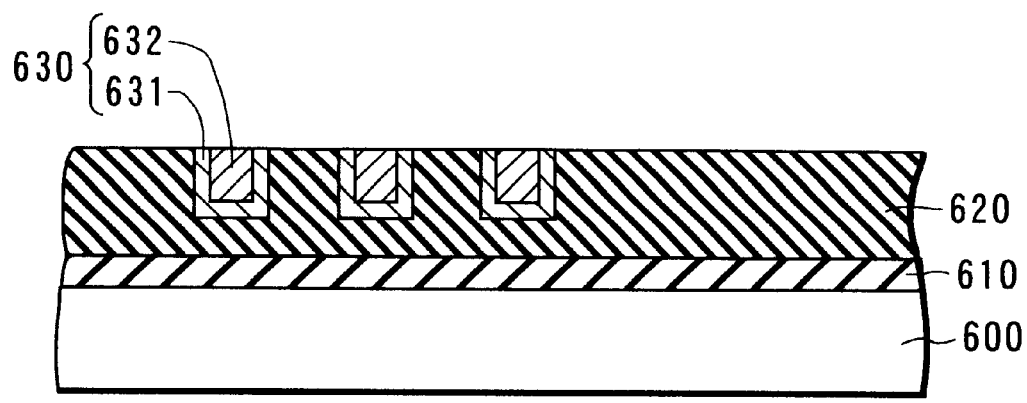
FIG. 25A to FIG. 25F are step sectional views sequentially showing the step regarding to the manufacturing method according to the tenth embodiment of the present invention.
Figure 25B:
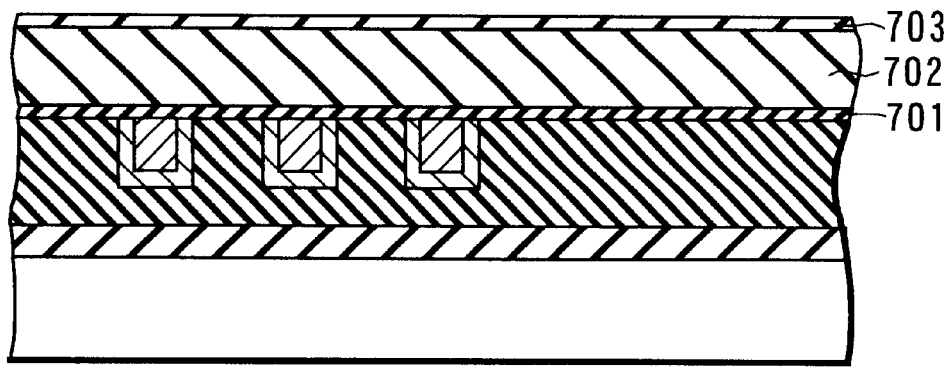
Figure 25C:
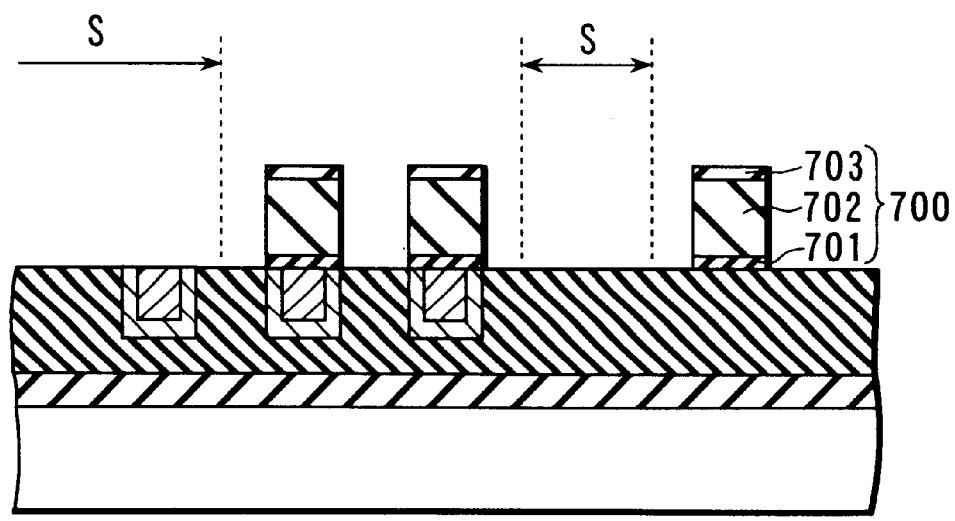
Figure 25D:
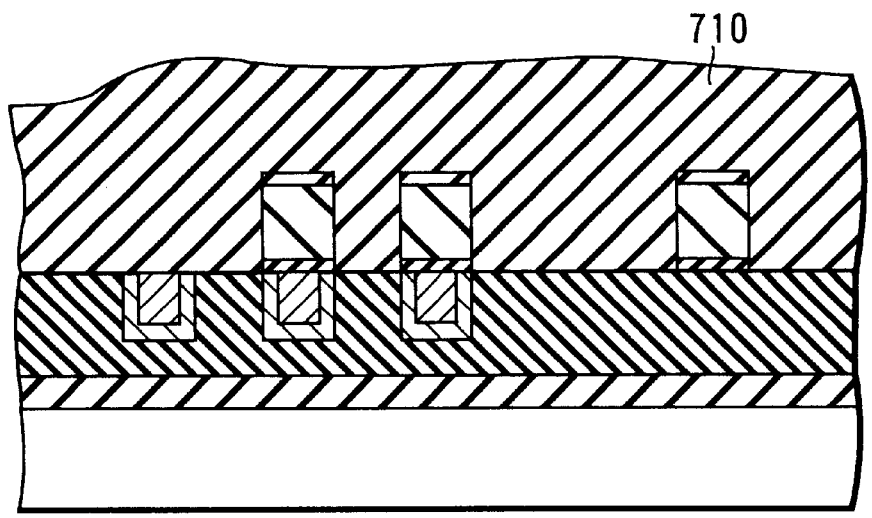
Figure 25E:
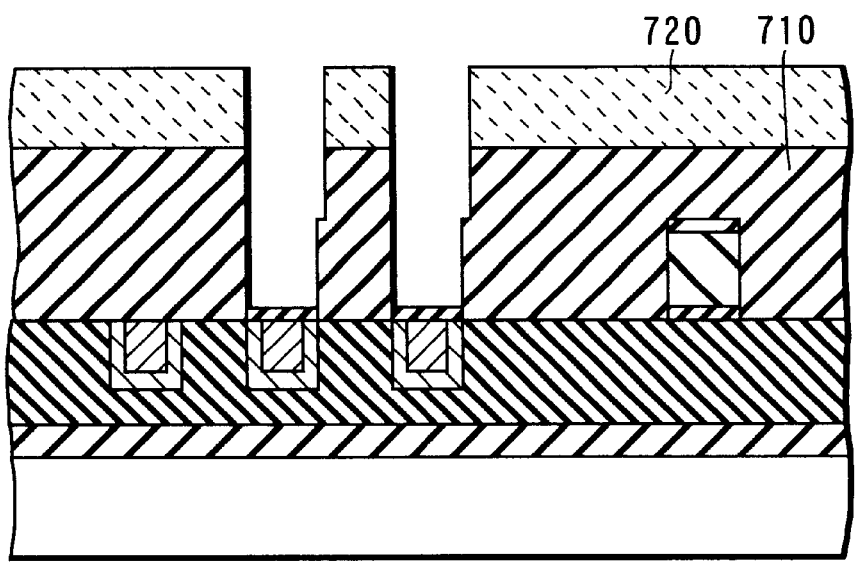
Figure 25F:
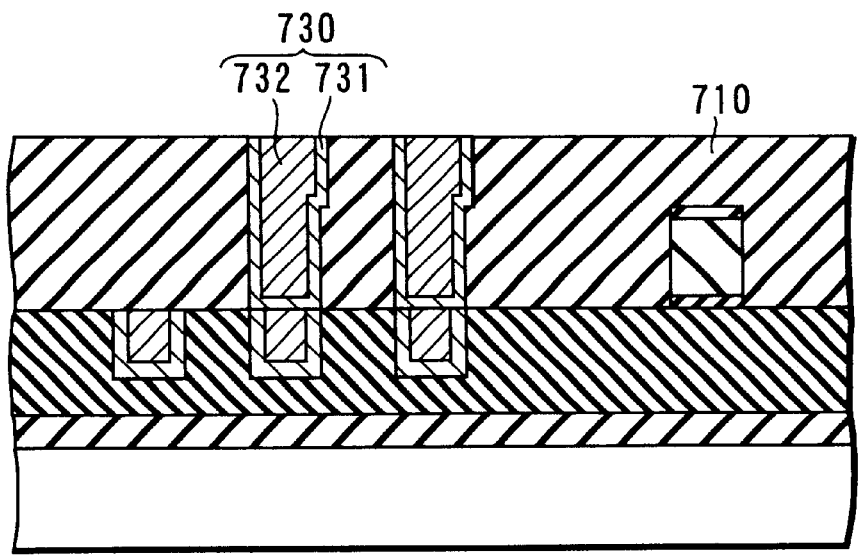

In this embodiment, a step in which a specific region is removed is performed as already explained, and the step in which the specific region is removed is performed in the step of FIG. 25C. That is, the pillar which becomes a dummy is not formed in a specific region S in the step of FIG. 25C which differs from the ninth embodiment shown in FIG. 22C. As a result, the pillar which becomes a dummy is not formed in the specific region in the structure finally obtained as shown in FIG. 25F.

Some embodiments of the present invention are explained above, but the present invention is not limited to each of these embodiments and can be carried out by a variety of transforming it within the scope of the present invention.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed:

1. A semiconductor device comprising:
   a semiconductor substrate in which a first insulating layer having a trench where a lower level wiring is buried is formed;
   a conductive pillar-shaped structure which is connected with said lower level wiring and formed on said semiconductor substrate, and wherein a thin film which becomes a hard mask on an upper portion thereof, and formed by using the hard mask as an etching mask;
   a second insulating layer formed on said semiconductor substrate to surround said pillar-shaped structure, said second insulating layer having at least one trench which has a trench formed by exposing at least said hard mask by selectively etching a surface of said second insulation layer, and being formed by removing said hard mask;
   an upper level wiring which is formed by being buried in said trench, and is electrically connected with said pillar-shaped structure; and
   a protection film formed on a surface of said lower level wiring which is not covered with at least said pillar-shaped structure.

2. The semiconductor device according to claim 1, said at least one trench in said second insulation film is formed by removing said protection film on a surface of said pillar-shaped structure, after a protection film is formed on a surface of said lower level wiring which is not covered with at least said pillar-shaped structure.

3. A semiconductor device comprising:
   a semiconductor substrate in which a first insulation layer having a trench where a lower level wiring is buried is formed;
   a conductive pillar-shaped structure which is connected with said lower level wiring and formed on said semiconductor substrate;
   a second insulation layer formed on said semiconductor substrate to surround said pillar-shaped structure, said second insulating layer having a first trench having a same horizontal section shape as said pillar-shaped structure and a second trench which is formed on an upper portion of said first trench and has a horizontal cross-section larger than a cross-section in a horizontal section of said pillar-shaped structure;
   an upper level wiring formed in said first trench and said second trench and electrically connected with said pillar-shaped structure; and
   a protection film formed on a surface of said lower level wiring which is not covered with at least said pillar-shaped structure.

4. A semiconductor device comprising:
   a semiconductor substrate in which a first insulation layer having a trench where a lower level wiring is buried;
   a conductive layer having a component, which includes a barrier metal function, formed in said lower level wiring;
   a conductive pillar-shaped structure connected with said conductive layer and formed on said semi-conductor substrate;

a second insulation layer formed on said semi-conductor substrate to surround said pillar-shaped structure, said second insulation layer having of a trench formed to expose an upper portion of said pillar-shaped structure; and an upper level wiring formed in said trench and electrically connected with said pillar-shaped structure.

5. The semiconductor device according to claim 4, wherein said conductive layer has at least two layers.

6. The semiconductor device according to claim 5, wherein said conductive layer has at least first and second layers, the first layer of said conductive layer functions as an etching stopper when said pillar-shaped structure is processed and a barrier layer, and the second layer of said conductive layer has lower resistance than the first layer and functions as an etching stopper when said pillar-shaped structure is processed.

7. The semiconductor device according to claim 4, wherein said conductive layer includes WN.

8. The semiconductor device according to claim 5, wherein said conductive layer includes W.

9. The semiconductor device according to claim 4, wherein
surfaces of said lower level wiring and said first insulation layer is substantially in a same plane,
said conductive layer is formed so as to be connected with at least a part of said lower level wiring, and
said semiconductor device further comprises a protection film coating a surface of said lower level wiring which is not covered with at least said pillar-shaped structure, and formed to deposit on an upper portion of said pillar-shaped structure.

10. The semiconductor device according to claim 4, wherein said conductive layer is formed in said trench to cover all surfaces of said lower level wiring.

11. The semiconductor device according to claim 4, wherein said conductive layer includes material which can be selectively etched to said first insulation film.

12. The semiconductor device according to claim 4, wherein a horizontal section of said pillar-shaped structure is narrower than a horizontal section in said conductive layer.

13. The semiconductor device according to claim 4, wherein said pillar-shaped structure or a conductive layer has a shape of widening toward an end.

14. The semiconductor device according to claim 4, further comprising a protection film formed to cover a sidewall of said pillar-shaped structure, said lower level wiring, and said first insulation layer.

15. The semiconductor device according to claim 4, wherein said lower level wiring includes copper or an alloy thereof.

16. The semiconductor device according to claim 4, wherein said conductive layer is used as a CMP stopper when said lower level wiring is formed with the CMP.

17. The semiconductor device according to claim 16, wherein said lower level wiring includes copper or an alloy thereof.

18. A semiconductor device comprising:
a plurality of pillar-shaped structures formed in a connection region where a lower level wiring and an upper level wiring are electrically connected;
a plurality of dummy pillar-shaped structures formed in a predetermined region except said connection region; and
an interlevel insulation film formed to cover said plurality of pillar-shaped structures, wherein a layout data of said dummy pillar-shaped structure formed in said predetermined region is obtained by a NOR processing of data which corresponds to both information based on layout information of a layout of said lower level wiring and layout information of a layout of said upper level wiring.

19. The semiconductor device according to claim 18, wherein a pillar-shaped structure formed in said connection region and said predetermined region is formed with a conductor.

20. The semiconductor device according to claim 18, wherein said dummy pillar-shaped structure formed in said predetermined region is formed in a region except a pregiven specific region.

21. A semiconductor device comprising:
a plurality of pillar-shaped structures formed in a connection region where a lower level wiring and an upper level wiring are electrically connected;
a plurality of dummy pillar-shaped structures formed in a predetermined region except said connection region; and
an interlevel insulation film formed to cover said plurality of pillar-shaped structures, wherein
a layout data of a pillar-shaped structure formed in said predetermined region is obtained by a NOT processing of data which corresponds to the information based on the layout information of a layout of said connection region.

22. The semiconductor device according to claim 21, wherein the pillar-shaped structure formed in said connection region is removed after said interlevel insulation film is formed.

23. The semiconductor device according to claim 21, wherein said dummy pillar-shaped structure formed in said predetermined region is formed in regions except a pregiven specific region.

24. The semiconductor device according to claim 22, wherein said dummy pillar-shaped structure formed in said connection region and said predetermined region is formed with the insulator.

25. A semiconductor device comprising:
a semiconductor substrate in which a first insulation layer having a trench where a lower level wiring is buried is formed;
a conductive pillar-shaped structure which is connected with said lower level wiring and formed on said semiconductor substrate;
a protection film coating a surface of said lower level wiring which is not covered with at least said pillar-shaped structure, and formed to deposit on an upper portion of said pillar-shaped structure;
a second insulation layer formed on said semiconductor substrate to surround said pillar-shaped structure, said second insulation layer having at least one trench which has a trench formed by selectively etching and exposing at least an upper portion of said protection film and formed removing a part of at least the upper portion of said protection film; and
an upper level wiring which is formed by being buried in said trench, and is electrically connected with said pillar-shaped structure.

26. A semiconductor device comprising:
a semiconductor substrate in which a first insulation layer having a trench where a lower level wiring is buried is formed;

a conductive pillar-shaped structure which is connected with said lower level wiring and formed on said semiconductor substrate;

a second insulation layer formed on said semiconductor substrate to surround said pillar-shaped structure, a third insulation layer formed on said second insulation layer having a first trench having the same horizontal section shape as said pillar-shaped structure and a second trench which is formed on an upper portion of said first trench and has a horizontal cross-section larger than a cross-section in a horizontal section of said pillar-shaped structure;

an upper level wiring formed in said first trench and said second trench and electrically connected with said pillar-shaped structure; and a protection film formed on a surface of said lower level wiring which is not covered with at least said pillar-shaped structure.

* * * * *

UNITED STATES PATENT AND TRADEMARK OFFICE
CERTIFICATE OF CORRECTION

PATENT NO.     : 6,291,891 B1
DATED          : September 18, 2001
INVENTOR(S)    : Kazuyuki Higashi et al.

It is certified that error appears in the above-identified patent and that said Letters Patent is hereby corrected as shown below:

Column 24,
Line 66, "semi-conductor" should read -- semiconductor --.

Column 25,
Line 1, "semi-conductor" should read -- semiconductor --.
Line 3, "having", delete "of".
Line 56, "claim 16" should read -- claim 11 --.

Signed and Sealed this

Fourteenth Day of May, 2002

Attest:

JAMES E. ROGAN
Attesting Officer
Director of the United States Patent and Trademark Office